US008362487B2

(12) United States Patent
Yamazaki et al.

(10) Patent No.: US 8,362,487 B2
(45) Date of Patent: *Jan. 29, 2013

(54) LIGHT EMITTING DEVICE COMPRISING FILM HAVING HYGROSCOPIC PROPERTY AND TRANSPARENCY

(75) Inventors: Shunpei Yamazaki, Tokyo (JP); Toru Takayama, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/802,961

(22) Filed: May 29, 2007

(65) Prior Publication Data

US 2007/0228382 A1 Oct. 4, 2007

Related U.S. Application Data

(62) Division of application No. 10/636,545, filed on Aug. 8, 2003, now Pat. No. 7,230,271.

(30) Foreign Application Priority Data

Jun. 11, 2002 (JP) .................................. 2002-169819
Aug. 9, 2002 (JP) .................................. 2002-233691

(51) Int. Cl.
*H01L 29/04* (2006.01)
*H01L 33/00* (2010.01)
(52) U.S. Cl. ................. 257/72; 257/59; 257/83; 257/98
(58) Field of Classification Search ................... 257/59, 257/66, 72, 79, 83, 84, 98, 100
See application file for complete search history.

(56) References Cited

U.S. PATENT DOCUMENTS

| 4,599,538 | A | 7/1986 | Hidler et al. |
| 5,107,175 | A | 4/1992 | Hirano et al. |
| 5,124,204 | A | 6/1992 | Yamashita et al. |

(Continued)

FOREIGN PATENT DOCUMENTS

| EP | 0 717 439 A2 | 6/1996 |
| EP | 0 999 595 A2 | 5/2000 |

(Continued)

OTHER PUBLICATIONS

N.K. Kim, "SrO Pellet Developed by Toshima MFG., Ltd., Which is Attracted Attention in PDP and Organic ELD, is Appticabte to Material for Protective Film in PDP and Material for Absorbent Film in Organic ELD", Semiconductor FPD World, (pp. 85-87); Mar. 2002.

(Continued)

*Primary Examiner* — Ori Nadav
(74) *Attorney, Agent, or Firm* — Nixon Peabody LLP; Jeffrey L. Costellia

(57) ABSTRACT

A light emitting element having an organic compound, which can be extended its longevity is provided. According to the present invention, there is provided a constitution in which, in order to protect a light emitting element from moisture, an inorganic insulating film 312a, a stress relaxation layer 312b having transparency and a hygroscopic property, and an inorganic insulating film 312c are repeatedly laminated over a cathode. The stress relaxation layer 312b having transparency and the hygroscopic property uses at least one film selected from the group consisting of a film comprising a same material as that of a layer 310, containing an organic compound, sandwiched between a cathode and an anode, a layer capable of being formed by vapor deposition, and a layer capable of being formed by coating.

40 Claims, 13 Drawing Sheets

U.S. PATENT DOCUMENTS

| | | | |
|---|---|---|---|
| 5,189,405 A | 2/1993 | Yamashita et al. | |
| 5,343,052 A * | 8/1994 | Oohata et al. | 257/141 |
| 5,518,824 A | 5/1996 | Funhoff et al. | |
| 5,550,066 A | 8/1996 | Tang et al. | |
| 5,652,067 A | 7/1997 | Ito et al. | |
| 5,684,365 A | 11/1997 | Tang et al. | |
| 5,686,360 A | 11/1997 | Harvey et al. | |
| 5,693,956 A | 12/1997 | Shi et al. | |
| 5,757,126 A | 5/1998 | Harvey et al. | |
| 5,771,562 A | 6/1998 | Harvey et al. | |
| 5,811,177 A | 9/1998 | Shi et al. | |
| 5,817,366 A | 10/1998 | Arai et al. | |
| 5,821,138 A | 10/1998 | Yamazaki et al. | |
| 5,909,038 A | 6/1999 | Hwang et al. | |
| 5,909,081 A | 6/1999 | Eida et al. | |
| 5,952,708 A | 9/1999 | Yamazaki | |
| 5,952,778 A | 9/1999 | Haskal et al. | |
| 5,953,094 A | 9/1999 | Matsuoka et al. | |
| 5,962,962 A | 10/1999 | Fujita et al. | |
| 5,990,542 A | 11/1999 | Yamazaki | |
| 5,990,615 A | 11/1999 | Sakaguchi et al. | |
| 5,990,629 A | 11/1999 | Yamada et al. | |
| 6,046,543 A | 4/2000 | Bulovic et al. | |
| 6,049,167 A | 4/2000 | Onitsuka et al. | |
| 6,118,212 A | 9/2000 | Nakaya et al. | |
| 6,121,542 A * | 9/2000 | Shiotsuka et al. | 136/256 |
| 6,121,726 A | 9/2000 | Codama et al. | |
| 6,127,199 A | 10/2000 | Inoue et al. | |
| 6,132,280 A | 10/2000 | Tanabe et al. | |
| 6,146,225 A | 11/2000 | Sheats et al. | |
| 6,150,187 A | 11/2000 | Zyung et al. | |
| 6,160,346 A | 12/2000 | Vleggaar et al. | |
| 6,169,293 B1 | 1/2001 | Yamazaki | |
| 6,172,459 B1 | 1/2001 | Hung et al. | |
| 6,195,142 B1 | 2/2001 | Gyotoku et al. | |
| 6,198,217 B1 | 3/2001 | Suzuki et al. | |
| 6,198,220 B1 | 3/2001 | Jones et al. | |
| 6,214,631 B1 * | 4/2001 | Burrows et al. | 438/22 |
| 6,239,470 B1 | 5/2001 | Yamazaki | |
| 6,268,695 B1 | 7/2001 | Affinito | |
| 6,274,887 B1 | 8/2001 | Yamazaki et al. | |
| 6,323,924 B1 | 11/2001 | Matsuoka et al. | |
| 6,372,608 B1 | 4/2002 | Shimoda et al. | |
| 6,376,333 B1 | 4/2002 | Yamazaki et al. | |
| 6,413,645 B1 | 7/2002 | Graff et al. | |
| 6,441,468 B1 | 8/2002 | Yamazaki | |
| 6,445,059 B1 | 9/2002 | Yamazaki | |
| 6,515,310 B2 | 2/2003 | Yamazaki et al. | |
| 6,525,339 B2 | 2/2003 | Motomatsu | |
| 6,559,594 B2 | 5/2003 | Fukunaga et al. | |
| 6,582,876 B2 * | 6/2003 | Wolk et al. | 430/200 |
| 6,599,783 B2 | 7/2003 | Takatoku | |
| 6,605,826 B2 | 8/2003 | Yamazaki et al. | |
| 6,617,052 B2 | 9/2003 | Morii | |
| 6,638,645 B2 * | 10/2003 | Sawai et al. | 428/690 |
| 6,660,409 B1 | 12/2003 | Komatsu et al. | |
| 6,664,732 B2 | 12/2003 | Yamazaki et al. | |
| 6,710,542 B2 | 3/2004 | Chun et al. | |
| 6,720,203 B2 | 4/2004 | Carcia et al. | |
| 6,728,278 B2 * | 4/2004 | Kahen et al. | 372/39 |
| 6,737,753 B2 | 5/2004 | Kumar et al. | |
| 6,739,931 B2 | 5/2004 | Yamazaki et al. | |
| 6,768,260 B2 | 7/2004 | Fukunaga et al. | |
| 6,776,880 B1 | 8/2004 | Yamazaki | |
| 6,777,621 B2 | 8/2004 | Ishikawa et al. | |
| 6,792,333 B2 | 9/2004 | Yamazaki | |
| 6,803,127 B2 | 10/2004 | Su et al. | |
| 6,806,638 B2 | 10/2004 | Lih et al. | |
| 6,819,044 B2 | 11/2004 | Shirakawa et al. | |
| 6,828,727 B2 | 12/2004 | Yamazaki | |
| 6,831,298 B2 | 12/2004 | Park et al. | |
| 6,833,668 B1 | 12/2004 | Yamada et al. | |
| 6,835,950 B2 | 12/2004 | Brown et al. | |
| 6,849,877 B2 | 2/2005 | Yamazaki et al. | |
| 6,869,635 B2 | 3/2005 | Kobayashi | |
| 6,897,608 B2 | 5/2005 | Yamazaki et al. | |
| 6,924,594 B2 | 8/2005 | Ogura et al. | |
| 6,940,223 B2 | 9/2005 | Yamazaki | |
| 6,963,168 B2 | 11/2005 | Eida et al. | |
| 6,965,195 B2 | 11/2005 | Yamazaki et al. | |
| 6,995,511 B2 | 2/2006 | Yamazaki et al. | |
| 7,012,367 B2 | 3/2006 | Seki | |
| 7,034,456 B2 | 4/2006 | Yamazaki et al. | |
| 7,045,822 B2 | 5/2006 | Tsuchiya | |
| 7,101,242 B2 | 9/2006 | Fukunaga et al. | |
| 7,187,121 B2 | 3/2007 | Hasegawa et al. | |
| 7,202,504 B2 | 4/2007 | Ikeda et al. | |
| 7,211,828 B2 | 5/2007 | Yamazaki et al. | |
| 7,230,271 B2 | 6/2007 | Yamazaki et al. | |
| 7,301,277 B2 | 11/2007 | Hayashi | |
| 7,332,859 B2 | 2/2008 | Hasegawa et al. | |
| 7,420,208 B2 | 9/2008 | Yamazaki et al. | |
| 7,427,832 B2 | 9/2008 | Kobayashi | |
| 7,459,849 B2 | 12/2008 | Yamazaki | |
| 7,488,985 B2 | 2/2009 | Tsuchiya | |
| 7,514,868 B2 | 4/2009 | Yamazaki et al. | |
| 7,572,478 B2 | 8/2009 | Ogura et al. | |
| 7,683,535 B2 | 3/2010 | Fukunaga et al. | |
| 7,692,378 B2 | 4/2010 | Yamazaki | |
| 7,696,524 B2 | 4/2010 | Ikeda et al. | |
| 7,728,326 B2 | 6/2010 | Yamazaki et al. | |
| 7,745,993 B2 | 6/2010 | Fukunaga et al. | |
| 7,867,053 B2 | 1/2011 | Fukunaga et al. | |
| 7,932,667 B2 | 4/2011 | Tsuchiya | |
| 7,952,101 B2 | 5/2011 | Yamazaki et al. | |
| 2002/0030193 A1 | 3/2002 | Yamazaki et al. | |
| 2002/0125817 A1 | 9/2002 | Yamazaki et al. | |
| 2003/0034497 A1 | 2/2003 | Yamazaki et al. | |
| 2003/0094615 A1 | 5/2003 | Yamazaki et al. | |
| 2003/0107326 A1 | 6/2003 | Park et al. | |
| 2003/0116768 A1 | 6/2003 | Ishikawa | |
| 2003/0146439 A1 | 8/2003 | Yamazaki et al. | |
| 2003/0146695 A1 | 8/2003 | Seki | |
| 2003/0211667 A1 | 11/2003 | Takatoku | |
| 2003/0211668 A1 | 11/2003 | Takatoku | |
| 2003/0230972 A1 | 12/2003 | Cok | |
| 2004/0228569 A1 | 11/2004 | Yamazaki | |
| 2005/0093436 A1 | 5/2005 | Yamazaki | |
| 2005/0098113 A1 | 5/2005 | Hayashi | |
| 2005/0263775 A1 | 12/2005 | Ikeda et al. | |
| 2005/0264182 A1 | 12/2005 | Seki | |
| 2005/0269578 A1 | 12/2005 | Barnes et al. | |
| 2005/0275346 A1 | 12/2005 | Eida et al. | |
| 2006/0141645 A1 | 6/2006 | Yamazaki et al. | |
| 2007/0096641 A1 | 5/2007 | Hasegawa et al. | |
| 2007/0181912 A1 | 8/2007 | Ikeda et al. | |
| 2008/0042562 A1 | 2/2008 | Hayashi | |
| 2008/0258617 A1 | 10/2008 | Kobayashi | |
| 2010/0148204 A1 | 6/2010 | Ikeda et al. | |
| 2010/0163859 A1 | 7/2010 | Yamazaki et al. | |
| 2011/0101852 A1 | 5/2011 | Fukunaga et al. | |
| 2011/0233557 A1 | 9/2011 | Yamazaki et al. | |

FOREIGN PATENT DOCUMENTS

| | | |
|---|---|---|
| EP | 1 058 314 A2 | 12/2000 |
| EP | 1 058 484 A1 | 12/2000 |
| EP | 1 191 823 A1 | 3/2002 |
| EP | 1 137 165 A1 | 6/2003 |
| JP | 05-044017 | 2/1993 |
| JP | 05-315630 | 11/1993 |
| JP | 07-192866 | 7/1995 |
| JP | 08-068990 | 3/1996 |
| JP | 08-241047 | 9/1996 |
| JP | 08-288522 | 11/1996 |
| JP | 09-033933 | 2/1997 |
| JP | 10-125929 | 5/1998 |
| JP | 10-125931 | 5/1998 |
| JP | 10-282507 | 10/1998 |
| JP | 11-218777 | 8/1999 |
| JP | 11-329719 | 11/1999 |
| JP | 2000-048951 | 2/2000 |
| JP | 2000-357735 | 12/2000 |
| JP | 2001-118674 | 4/2001 |
| JP | 2001-249627 | 9/2001 |
| JP | 2001-272923 | 10/2001 |
| JP | 2001-282123 | 10/2001 |
| JP | 2001-326071 | 11/2001 |

| JP | 2001-332741 | 11/2001 |
| JP | 2001-357973 | 12/2001 |
| JP | 2002-025765 | 1/2002 |
| JP | 2002-082633 | 3/2002 |
| JP | 2002-117973 | 4/2002 |
| JP | 2002-134270 | 5/2002 |
| JP | 2002-164181 | 6/2002 |
| JP | 2002-203682 | 7/2002 |
| JP | 2002-208477 | 7/2002 |
| JP | 2003-017244 | 1/2003 |
| JP | 2003-203771 | 7/2003 |
| JP | 2001-357973 | 12/2011 |
| WO | WO 01/63975 A1 | 8/2001 |

OTHER PUBLICATIONS

Tsutsui, Tetsuo, et al., "High Quantum Efficiency in Organic Light-Emitting Devices With Iridium-Complex As a Triplet Emissive Center", Japanese Applied Phys. vol. 38, Part.2, No. 12B, Dec. 15, 1999, pp. L1502-L1504.

Tsutsui, Tetsuo, et al., "High Quantum Efficiency in Organic Light-Emitting Devices With Iridium-Complex As a Triplet Emissive Center", Japanese Journal of Applied Physics. vol. 38, Part.2, No. 12B, Dec. 15, 1999, pp. L1502-L1504.

Hung.L et al., "Application of an ultrathin LiF/Al bilayer in organic surface-emitting diodes,", APPL. PHYS LETT. (APPLIED PHYSICS LETTERS), Jan. 22, 2001, vol. 78, No. 4, pp. 544-546.

Claims as allowed in Notice of Allowance dated Aug. 25, 2011, re U.S. Appl. No. 12/706,012, to Hsiao Ikeda et al.

Notice of Allowance dated Aug. 25, 2011, re U.S. Appl. No. 12/706,012, to Hsiao Ikeda et al.

N. K. Kim, "SrO Pellet Developed by Toshima Mfg., Ltd., Which Is Attracted Attention in PDP and Organic ELD, Is Applicable to Material for Protective Film in PDP and Material for Absorbent Film in Organic ELD", Semiconductor FPD World, (pp. 85-87); Mar. 2002.

Baldo, M.A. et al., "Highly Efficient Phosphorescent Emission From Organic Electroluminescent Devices", Nature, vol. 395, Sep. 10, 1998 pp. 151-154.

Baldo, M.A. et al., "Very High-Efficiency Green Organic Light-Emitting Devices Based on Electrophosphorescence", Applied Physics Letters, vol. 75, No. 1, Jul. 5, 1999, pp. 4-6.

Tsutsui, Tetsuo, et al., "Electroluminescence in Organic Thin Films", Photochemical Processes in Organized Molecular Systems, Proceeding on Sep. 22-24, 1990; 1991; pp. 437-450.

Tsutsui, Tetsuo, et al, "High Quantum Efficiency in Organic Light-Emitting Devices With Iridium-Complex As a Triplet Emissive Center", Japanese Applied Phys. vol. 38, Dec. 15, 1999, pp. L1502-L1504.

Y. Tsltruoka et al., "21.2: Transparent Thin Film Desiccant for Oleds" SID 03 Digest pp. 860-863, 2003.

Partial English translation of Japanese Patent No. 05-44017, Feb. 23, 1993.

Partial English translation of Japanese Patent No. 2001-357973, Dec. 26, 2011.

\* cited by examiner region of vapor deposition mask for R region of vapor deposition mask for B region of vapor deposition mask for G region of depositted light emitting region

LIGHT EMITTING DEVICE COMPRISING FILM HAVING HYGROSCOPIC PROPERTY AND TRANSPARENCY

This application is Divisional of U.S. application Ser. No. 10/636,545 filed Aug. 8, 2003 now U.S. Pat. No. 7,230,271.

BACKGROUND OF THE INVENTION

1. Field of the Invention

The present invention relates to a semiconductor device having a circuit comprised of thin film transistor (hereinafter, TFT) and a manufacturing method thereof. For instance, the present invention relates to a light emitting device using a light emitting element which has a film containing an organic compound (hereinafter, organic compound layer) between a pair of electrodes and which can give fluorescence or luminescence by receiving an electric field, and a manufacturing method thereof. The light emitting device referred to in the present specification is an image display device, a light emitting device or a light source (including lighting installation). Additionally, the following are included in examples of the light emitting device: a module wherein a connector, for example, a flexible printed circuit (FPC) or a tape automated bonding (TAB) tape, or a tape carrier package (TCP) is set up onto a light emitting element; a module wherein a printed wiring board is set to the tip of a TAB tape or a TCP; and a module wherein integrated circuits (IC) are directly mounted on a light emitting element in a chip on glass (COG) manner.

In addition, the semiconductor device in this specification is the device in general which can function by utilizing the semiconductor characteristics. An electro-optic device, a light emitting device, a semiconductor circuit and an electronic device are all semiconductor devices.

2. Related Art

A light emitting element using an organic compound as a luminous body, characterized by its thin thickness, light weight, high-speed response, low-voltage DC drive, and so on, has been expected its application to a next-generation flat panel display. Especially a display device, in which light emitting elements are arranged in a matrix configuration, is considered that it has an advantage over the conventional liquid crystal display device in terms of its wide angle and superior visibility.

A light emitting mechanism of a light emitting element may be as follows. That is, when a voltage is applied on the organic compound layer sandwiched between a pair of the electrodes, an electron injected from the cathode and an electron hole injected from the anode are brought into recombination with each other at the luminescence center of the organic compound layer to form a molecular excitation. Subsequently, light emission is occurred by discharging energy when the molecular excitation returns to a ground state. There are two types of the excitation state, a singlet exciton and a triplet exciton. The light emission may achieved in either state.

The light emitting device constructed of a plurality of light emitting elements arranged in a matrix configuration may be operated by a passive matrix drive (passive matrix type) and an active matrix drive (active matrix type). However, when the pixel density increases, it may be preferable to use the active matrix type in which a switch is provided for every pixel (or every dot) since it can be driven at a low voltage.

Furthermore, low-molecular type material and high-molecular type (polymer) material have been studied for an organic compound to be provided as an organic compound layer (i.e., a light emitting layer in the strict sense), which may be a center of a light emitting element. Among them, the attention has been focused on the high-molecular type material because of its high heat resistance and convenience in handling compared with the low-molecular type material.

For forming a film from an organic compound, vapor deposition, spin-coating, and ink-jetting have been known. Among them, for realizing a full-color image formation using a polymer material, the spin-coating and the ink-jetting have been particularly known.

The disadvantage of a light emitting element having an organic compound is easily deteriorated by various factors, so that the greatest object thereof is to increase its reliability (make longer its life span).

A light emitting element having an organic compound is deteriorated mainly by oxygen and moisture. As a defective state due to this, the partial deterioration of luminance and nonluminous region are occurred.

The expansion of nonluminous region may proceed merely with time or with time during which light emitting element is driven. Particularly, in the case nonluminous region is occurred soon after manufacturing a light emitting material having an organic compound, the expansion of nonluminous region is often proceeded with time, and is sometimes end up with whole nonluminous region.

In addition, the nonluminous region tends to generate from a marginal portion of luminous region, and expands with time as if contracting the luminous region. Therefore, this defective mode is called shrink.

These defects cause a certain light emitting element to be a nonluminous element at high speed, particularly, with respect to an active matrix type light emitting device, because shrink heavily damages such a small light emitting region in the active light emitting device. Further, in the case the area of luminous region is small, the proportion of nonluminous region becomes bigger, according to the reduction of luminous region. Therefore, when manufacturing a display device using a light emitting element, it is difficult to obtain a display device which has a high-definition (basically a pitch of a pixel area is small) and higher reliability.

Non luminous region such as a black spot may be generated just after manufacturing a light emitting element having an organic compound, This defective mode is referred to as dark spot. And this dark spot may be enlarged with time.

SUMMARY OF THE INVENTION

An object of the present invention is to extend longevity of a light emitting element having an organic compound.

According to the present invention, in order to protect a light emitting element from moisture, there is provided a structure, in which a stress relaxation layer having transparency and a hygroscopic property and an inorganic insulating film are repeatedly laminated over a cathode. The stress relaxation layer having transparency and the hygroscopic property uses at least one film selected from the group consisting of: a film comprising a same material as that of a layer, which is containing an organic compound and sandwiched between a cathode and an anode; a layer capable of being formed by vapor deposition; and a layer capable of being formed by coating.

As for such inorganic insulating films, a silicon nitride film to be obtained by sputtering or CVD, a silicon oxide film, a silicon oxynitride film (SiNO film (component ratio: N>O), or SiON film (component ratio: N<O)), or a thin film containing carbon as a primary component (for example, a DLC film, or a CN film) can be used. These inorganic insulating films each have a high blocking effect against moisture; however, as film thickness thereof is increased, a film stress is increased and they tend to be partially peeled or totally removed as a film. Nevertheless, stress can be relaxed and, also, moisture can be absorbed by sandwiching the stress relaxation layer between the inorganic insulating films. Even when a minute hole is formed in the inorganic insulating film, the minute hole can be blocked by the stress relaxation layer and, further, by providing another inorganic insulating film thereover, an extremely high blocking effect against moisture or oxygen can be attained. A laminate formed in such a manner as described above is optimum as a sealing film of the light emitting element in which the layer containing the organic compound is allowed to be a light emitting layer.

Herein, a light emitting element to be formed by a cathode, an EL layer and an anode is defined as an EL element. There are two types of methods in such EL elements, namely, a type (referred to as passive matrix type) in which an EL layer is formed between two types of stripe-shaped electrodes which are orthogonally arranged against each other, and the other type (referred to as active matrix type) in which an EL layer is formed between a pixel electrode which is connected to a TFT and aligned in a matrix manner, and a counter electrode. The sealing film according to the invention can be applied to any one of the above-described two types.

According to the invention, the above-described laminate may be provided one or both surfaces of the substrate for a sealing. By using the resultant substrate as a sealed substrate of the light emitting element, the sealed substrate having an extremely high blocking effect against moisture or oxygen can be provided. Particularly, the laminate is effective when a plastic substrate, which has a lower blocking effect than that of a glass substrate, is used as a sealed substrate.

A constitution according to the invention disclosed herein is a light emitting device comprising a light emitting element comprising a cathode, a layer containing an organic compound, adjacent to the cathode, and an anode adjacent to the layer containing the organic compound over a substrate having an insulating surface, wherein the light emitting element is covered by a laminate comprising a first inorganic insulating film, a film having a hygroscopic property and transparency, and a second inorganic insulating film.

Further, the constitution according to the invention disclosed herein is also applicable to a top emission type light emitting device. Another constitution according to the invention is a light emitting device in which a light emitting element comprising a cathode, a layer containing an organic compound, adjacent to the cathode, and an anode adjacent to the layer containing the organic compound is sandwiched between a first substrate and a second substrate, wherein the light emitting element provided over the first substrate is covered by a laminate comprising a first inorganic insulating film, a film having a hygroscopic property, and a second inorganic insulating film; and luminescence from the light emitting element is allowed to pass through the second substrate, thereby being recognized by a user.

Further, the constitution according to the invention disclosed herein is also applicable to a bottom emission type light emitting device. Still another constitution according to the invention is a light emitting device in which a light emitting element comprising a cathode, a layer containing an organic compound, adjacent to the cathode, and an anode adjacent to the layer containing the organic compound is sandwiched between a first substrate and a second substrate, wherein the light emitting element provided over the first substrate is covered by a laminate comprising a first inorganic insulating film, a film having a hygroscopic property and transparency, and a second inorganic insulating film; and luminescence from the light emitting element is allowed to pass through the first substrate, thereby being recognized by a user. Since the above constitution is a bottom emission type, the film having the hygroscopic property may be transparent, translucent, or may have a light blocking property.

Further, in any one of the above-described constitutions, the film having the hygroscopic property and transparency has a smaller stress than that of at least one of the first inorganic insulating film and the second inorganic insulating film, and has an effect to relax the stress of the first inorganic insulating film and the second inorganic insulating film.

Further, in any one of the above-described constitutions, at least one of the first inorganic insulating film and the second inorganic insulating film comprises at least one film selected from the group consisting of: a silicon nitride film to be obtained by sputtering or CVD, a silicon oxide film, a silicon oxynitride film, a DLC film, a CN film, and a laminate thereof. Among other things, it is desirable that at least one of the first inorganic insulating film and the second inorganic insulating film is a silicon nitride film formed by RF sputtering using silicon as a target.

Further, the dense silicon nitride film to be obtained by RF sputtering using silicon as a target effectively prevents a fluctuation of a threshold voltage to be caused by contaminating the TFT with an alkali metal or an alkali earth metal such as sodium, lithium, and magnesium, and also, exerts an extremely high blocking effect against moisture or oxygen. Still further, in order to enhance the blocking effect, it is desirable that contents of oxygen and hydrogen in the silicon nitride film is 10 atomic % or less and, preferably, 1 atomic % or less.

Specific sputtering conditions are set such that a nitrogen gas or a mixed gas of the nitrogen gas and a noble gas is used; pressure is set to be in the range of from 0.1 Pa to 1.5 Pa; frequency is set to be in the range of from 13 MHz to 40 MHz; power is set to be in the range of from 5 W/cm$^2$ to 20 W/cm$^2$; a substrate temperature is set to be in the range of from room temperature to 350° C.; a distance between a silicon target (1 to 10 Ωcm) and the substrate is set to be in the range of from 40 mm to 200 mm; and back pressure is set to be 1×10$^{-3}$ Pa or less. A heated noble gas may be flown to a back surface of the substrate. For example, a dense silicon nitride film obtained under the conditions of flow ratio of Ar: $N_2$=20 sccm: 20 sccm; pressure: 0.8 Pa; frequency: 13.56 MHz; power: 16.5 W/cm$^2$; substrate temperature: 200° C.; distance between silicon target and substrate: 60 mm; and back pressure: 3×10$^{-5}$ Pa has characteristics that etching speed (referred to speed at the time etching is performed at 20° C. by using LAL500; same is applied to descriptions below) is as slow as 9 nm/min or less (preferably, in the range of from 0.5 nm/min to 3.5 nm/min) and a hydrogen concentration is as low as 1×10$^{21}$ atoms/cm$^3$ or less (preferably, 5×10$^{20}$ atoms/cm$^3$ or less). The term "LAL500" used herein denotes "LAL500 SA buffered hydrofluoric acid" available from Hashimoto Kasei Co., Ltd., meaning an aqueous solution of $NH_4HF_2$ (7.13%) and $NH_4F$ (15.4%).

Further, the silicon nitride film obtained by sputtering has properties of specific inductive capacity: 7.02 to 9.3; refraction factor: 1.91 to 2.13; internal stress: 4.17×10$^8$ dyn/cm$^2$; and etching speed: 0.77 nm/min to 1.31 nm/min. The internal stress changes negative and positive signs thereof depending on compression stress and tensile stress, but it is treated herein as an absolute figure. A Si concentration and an N concentration measured by RBS of the silicon nitride film formed by sputtering are 37.3 atomic % and 55.9 atomic %, respectively. A hydrogen concentration, an oxygen concentration, and a carbon concentration measured by SIMS of the silicon nitride film formed by sputtering are $4 \times 10^{20}$ atoms/cm$^3$, $8 \times 10^{20}$ atoms/cm$^3$, and $1 \times 10^{19}$ atoms/cm$^3$, respectively. A light transmission factor of the silicon nitride film formed by sputtering in the visible light region is 80% or more.

In any one of the above-described constitutions, the thin film containing carbon as a primary component denotes at least one film selected from the group consisting of: a diamond-like carbon film (referred to also as DLC film) having a film thickness in the range of from 3 nm to 50 nm, a carbon nitride film (referred to as CN film), and an amorphous carbon film. The DLC film has an SP$^3$ bond as a carbon-carbon bond on the basis of short-distance order, but is in an amorphous state on the basis of a macroscopic viewpoint. A composition of the DLC film is carbon: 70 atomic % to 95 atomic %; and hydrogen: 5 atomic % to 30 atomic %. The DLC film is extremely hard and has an excellent insulation property. Further, the DLC film is chemically stable, is not easily change its property and is thin in thickness. Thermal conductivity of the DLC film is in the range of from 200 W/m·K to 600 W/m·K, thereby being capable of releasing heat generated at the time of start-up. As described above, the DLC film has characteristics of low gas permeability against steam or oxygen. It is known that DLC film has hardness in the range of from 15 GPa to 25 GPa which is measured by a micro-hardness scale.

The DLC film can be formed by at least one method selected from the group consisting of: plasma CVD (as a typical example, RF plasma CVD, microwave CVD, electron cyclotron resonance (ECR) CVD, hot-filament CVD), combustion-flame, sputtering, ion beam vapor deposition, and laser vapor deposition. By using any one of these film-forming methods, the DLC film which has an excellent adhesion can be obtained. The DLC film is formed by setting a substrate over a cathode. In another case, a dense and hard film can be obtained by applying a negative bias to utilize an ion collision to some extent.

As for reaction gases to be used in forming of the DLC film, a hydrogen gas and a hydrocarbon type gas (for example, $CH_4$, $C_2H_2$, or $C_6H_6$) are used. These gases are ionized by glow discharge and the resultant ions, after being accelerated in velocity, collides with a cathode which is applied with negative self-bias, thereby forming a film. In such manner, a dense and smooth DLC film can be obtained. Further, the resultant DLC film is a transparent or translucent insulating film against visible light. The term "transparent against visible light" used herein is intended to mean that a transmission factor of the visible light is in the range of from 80% to 100%, while the term "translucent against visible light" used herein is intended to mean that a transmission factor of the visible light is in the range of from 50% to 80%.

As for reaction gases to be used in forming of the CN film, a nitrogen gas, and a hydrocarbon type gas (for example, $C_2H_2$, or $C_2H_4$) may be used.

In any one of the above-described constitutions, the film having the hygroscopic property and transparency is characterized by being a material film to be obtained by vapor deposition. For example, an alloy film of MgO, $SrO_2$, SrO, $CaF_2$, CaN or the like, or a material film containing an organic compound such as α-NPD (4,4'-bis-[N-(naphthyl)-N-phenyl-amino]biphenyl), BCP (bathocuproin), MTDATA (4,4', 4"-tris (N-3-methylphenyl-N-phenyl-amino) triphenylamine, or Alq$_3$ (a tris-8-quinolinolate aluminum complex) may be used. Therefore, the film having a hygroscopic property and transparency sometimes comprises a same material as that of at least one layer of a plurality of layers which constitute the layer containing the organic compound sandwiched between the cathode and the anode.

Further, the film having the hygroscopic property and transparency may be a polymeric material film containing an organic compound, obtained by coating (inkjetting or spin coating). For example, polyaniline or a polythiophene derivative (PEDOT) may be used.

Further, the invention is not limited to the laminate of cathode/first inorganic insulating film/film having hygroscopic property and transparency/second inorganic insulating film, but a laminate having more layers than the above laminate such as cathode/film having hygroscopic property and transparency/first inorganic insulating film/film having hygroscopic property and transparency/second inorganic insulating film and cathode/first inorganic insulating film/film having hygroscopic property and transparency/second inorganic insulating film/film having hygroscopic property and transparency/third inorganic insulating film.

Further, in any one of the above-described constitutions, in a case of manufacturing an active matrix type light emitting device, a light emitting element and a TFT connected to the light emitting element are provided over the first substrate.

A constitution according to the invention in regard to a manufacturing method for obtaining the above-described structure is a method for manufacturing a light emitting device comprising a light emitting element comprising a cathode, a layer containing an organic compound, adjacent to the cathode, and an anode adjacent to the layer containing the organic compound over a substrate having an insulating surface, the method, comprising the steps of: forming a TFT, and an anode connected to the TFT over the substrate; forming a layer containing an organic compound over the anode; forming a cathode over the layer containing the organic compound; forming a first inorganic insulating film over the cathode; forming a layer having a hygroscopic property and transparency over the first inorganic insulating film; and forming a second inorganic insulating film over the film having the hygroscopic property and transparency.

In the above-described constitution in regard to the manufacturing method, the steps of: forming the layer containing the organic compound; and forming the film having the hygroscopic property and transparency is characterized by using vapor deposition with resistance heating.

In the above-described constitution in regard to the manufacturing method, the film having the hygroscopic property and transparency has a smaller stress than that of at least one of the first inorganic insulating film and the second inorganic insulating film, and further, comprises a same material as that of at least one layer of a plurality of layers constituting the layer containing the organic compound sandwiched between the cathode and the anode.

In the above-described constitution in regard to the manufacturing method, at least one film of the first inorganic insulating film and the second inorganic insulating film is a silicon nitride film to be formed by RF sputtering using silicon as a target.

Further, a substrate laminated with the first inorganic insulating film, the film having a hygroscopic property and transparency, and the second inorganic insulating film may be used as a sealed substrate. Also, the constitution according to the invention is a light emitting device in which a light emitting element comprising a cathode, a layer containing an organic compound, adjacent to the cathode, and an anode adjacent to the layer containing the organic compound is sandwiched between a first substrate and a second substrate, wherein a laminate comprising a first inorganic insulating film, a film having a hygroscopic property and transparency, and a second inorganic insulating film is provided adjacent to the first substrate or the second substrate.

Further, a substrate in which the silicon nitride film formed over one or both surfaces thereof by RF sputtering using silicon as a target may be also a sealed substrate. Another the constitution according to the invention is a light emitting device in which a light emitting element comprising a cathode, a layer containing an organic compound, adjacent to the cathode, and an anode adjacent to the layer containing the organic compound is sandwiched between a first substrate and a second substrate, wherein a silicon nitride film formed by RF sputtering using silicon as a target is provided adjacent to the first substrate or the second substrate.

In the above-described constitution, the silicon nitride film has an etching speed of 9 nm/min or less, a hydrogen concentration of $1 \times 10^{21}$ atoms/cm$^3$ or less and, an oxygen concentration in the range of from $5 \times 10^{18}$ atoms/cm$^3$ to $5 \times 10^{21}$ atmos/cm$^3$. Further, in the above-described constitution, at least one of the first substrate and the second substrate is a plastic substrate. Particularly, the constitution is effective, when a plastic substrate which has a lower blocking effect than that of a glass substrate is used as a sealed substrate.

The plastic substrate is not particularly limited as long as it has flexibility, and the plastic substrate comprises at least one member selected from the group consisting of: polyethylene terephthalate (PET), polyether sulfone (PES), polyethylene naphthalate (PEN), polycarbonate (PC), nylon, polyether ether ketone (PEEK), polysulfone (PSF), polyether imide (PEI), polyallylate (PAR), polybutylene terephthalate (PBT), and polyimide.

An EL element is constituted such that an EL layer is sandwiched between a pair of electrodes, however, the EL layer ordinarily has a laminar constitution. As an illustrative example, a laminar constitution of "hole transport layer/light emitting layer/electron transport layer" proposed by Tang et al., Eastman Kodak Company, is mentioned. This constitution has an extremely high light emission efficiency and, almost all light emitting devices under development now adopt this constitution.

As examples of other constitutions than those described above, a constitution in which hole injection layer/hole transport layer/light emitting layer/electron transport layer are laminated in order over an anode, or another constitution in which hole injection layer/hole transport layer/light emitting layer/electron transport layer/electron injection layer are laminated in order over the anode is permissible. A fluorescent dye or the like may be doped in the light emitting layer. Further, these layers may be formed by using any one material selected from the group consisting of: a low molecular type material, a polymeric material, and an inorganic material.

Herein, all the layers which are sandwiched between the cathode and the anode are generically denoted as a layer containing an organic compound (referred to also as EL layer). Therefore, the above-described hole injection layer, hole transport layer, light emitting layer, electron transport layer and electron injection layer are all included in the EL layer. These layers can be formed by using at least one material selected from the group consisting of: a low molecular type organic compound material, a middle molecular type organic compound material, a polymeric organic compound material, and mixtures thereof. Further, a mixed layer in which an electron transport type material and a hole transport type material are appropriately mixed, or a mixed bonding in which a mixed region is formed in a bond interface of each material may be formed.

Further, carbazole type CBP+Ir (Ppy)$_3$ is an organic compound (referred to also as triplet compound) which can obtain luminescence (phosphorescence) from a triplet excited state thereof. This compound can also be used as a light emitting layer according to the invention. Since the luminescence (phosphorescence) from the triplet excited state has higher light emission efficiency than another luminescence (fluorescence) from a singlet excited state, the luminescence (phosphorescence) can reduce drive voltage (voltage required for allowing an organic light emitting element to emit light).

DETAILED DESCRIPTION OF THE PREFERRED EMBODIMENTS

The preferred Embodiment Modes and Embodiments are described below.

Embodiment Mode

Embodiment Mode 1

An top emission type light emitting device according to the invention will be described with reference to FIGS. 1A and 1B.

Figure 1A:
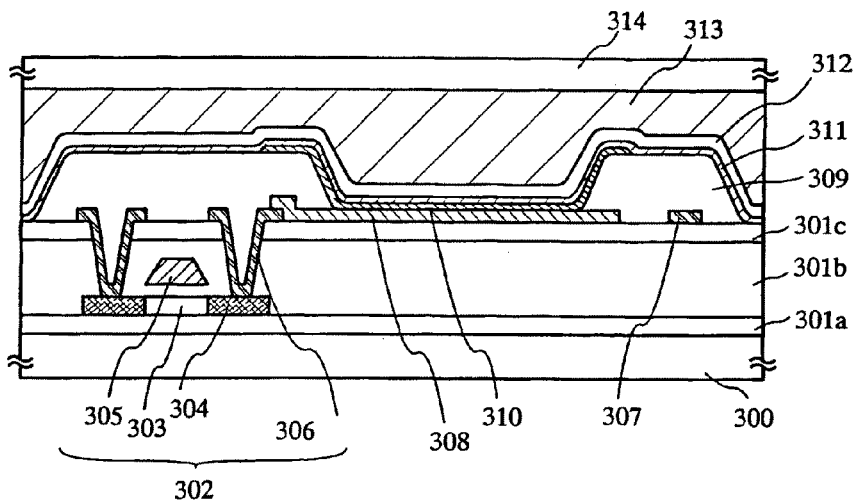
FIGS. 1A and 1B are cross-sectional views of Embodiment Mode 1, respectively.
Figure 1B:
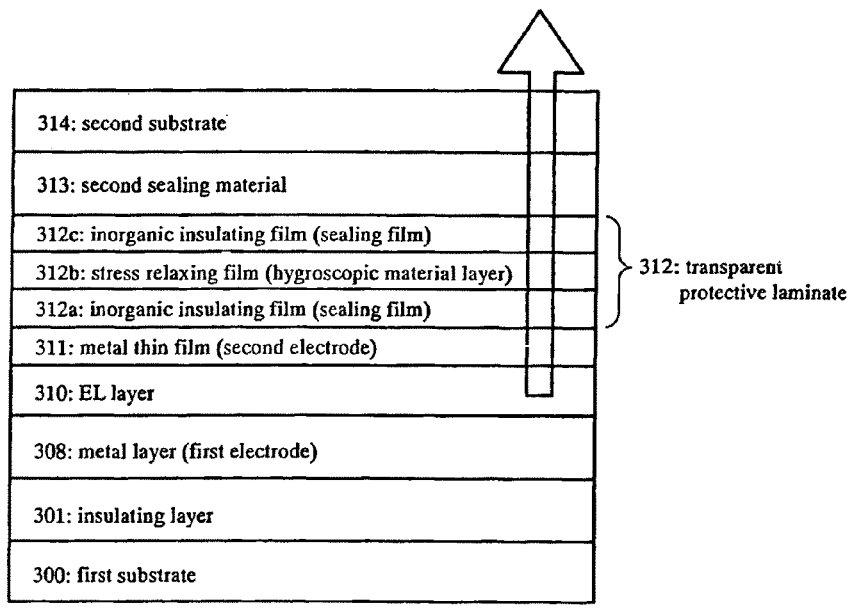

FIG. 1A is a cross-sectional view of a part of a pixel portion. FIG. 1B is a simplified view of a laminate constitution in a light emitting region whereupon luminescence is discharged in a direction which an arrow indicates. As for a configuration of light emitting region, namely, a configuration of pixel electrodes, a stripe arrangement, a delta arrangement, a mosaic arrangement and the like are mentioned.

In FIG. 1A, reference numeral 300 denotes a first substrate; reference numerals 301a, 301b, and 301c each designate insulating layers; reference numeral 302 denotes a TFT; reference numeral 308 denotes a first electrode; reference numeral 309 denotes an insulating material; reference numeral 310 denotes an EL layer; reference numeral 311 denotes a second electrode; reference numeral 312 denotes a transparent protective laminate; reference numeral 313 denotes a second sealing material; and reference numeral 314 denotes a second substrate.

The TFT 302 (p-channel type TFT) provided over the first substrate 300 is an element which controls an electric current flowing into a luminescent EL layer 310. Further, reference numeral 304 denotes a drain region (or source region); and reference numeral 306 denotes a drain electrode (or source electrode) which connects the first electrode to the drain region (or source region). Still further, in a same process as in the drain electrode 306, a wiring 307 such as a power supply wiring and a source wiring is simultaneously formed. An example in which the first electrode and the drain electrode are separately formed is described in the present Embodiment Mode; however, these electrodes may be a same one. An insulating layer 301a to be an undercoat insulating film (a lower layer thereof and an upper layer thereof are herein referred to as a nitride insulating film and an oxidized insulating film, respectively) is formed on the first substrate 300, while a gate insulating film is provided between a gate electrode 305 and an active layer. Further, reference numeral 301b denotes an interlayer insulating film comprising an organic material or an inorganic material; and reference numeral 301c denotes an interlayer insulating film comprising an inorganic insulating film. Still further, although not shown here, another TFT (n-channel type TFT or p-channel type TFT) or a plurality of TFTs are provided per pixel. TFT having one channel-forming region 303 is described in the present Embodiment Mode; however, TFT is not limited to this type and TFT may have a plurality of channels.

Reference numeral 308 denotes the first electrode, that is, an anode (or cathode) of a light emitting element. As for a material of the first electrode 308, a film or a laminate film which comprises an element selected from the group consisting of: Ti, TiN, $TiSi_xN_y$, Ni, W, $WSi_x$, $WN_x$, $WSi_xN_y$, NbN, Cr, Pt, Zn, Sn, In and Mo, or an alloy material or a compound material comprising any one of above-selected elements as a primary component, may be used in the range of from 100 nm to 800 nm as an entire film thickness. A titanium nitride film is used as the first electrode 308 in the present Embodiment Mode. When the titanium nitride film is used as the first electrode 308, it is preferable that a work function is allowed to be increased by subjecting a surface to a plasma treatment by means of a chlorine gas or to ultraviolet ray irradiation.

Further, an insulating material 309 (referred to also as a bank, a partition, a barrier, a mound or the like) which covers an edge of the first electrode 308 (and wiring 307) is provided. As for the insulating material 309, an inorganic material (for example, silicon oxide, silicon nitride, or silicon oxynitride), a photosensitive or non-photosensitive organic material (for example, polyimide, an acrylic resin, polyamide, polyimidoamide, resist or benzocyclobutene), a laminate of these materials, or the like can be used; however, a photosensitive organic resin covered with a silicon nitride film is used in the present Embodiment Mode. For example, when a positive type photosensitive acrylic resin is used as an organic resin material, it is preferable that only an upper edge portion of the insulating material is allowed to have a curved surface having a curvature radius. Further, as for the insulating material, either a negative type which becomes insoluble to an etchant by photosensitive light or a positive type which becomes soluble to the etchant by the light can be used.

A layer 310 containing an organic compound is formed by using vapor deposition or coating. For the purpose of improving reliability, it is preferable that deaeration is performed by vacuum heating (100° C. to 250° C.) immediately before the layer 310 containing the organic compound is formed. For example, when vapor deposition is used, such vapor deposition is performed in a film-forming chamber which is evacuated to a vacuum state up to a degree of vacuum of $5 \times 10^{-3}$ Torr (0.665 Pa), preferably in the range of from $10^{-4}$ Torr to $10^{-6}$ Torr. At the vapor deposition process, the organic compound is previously vaporized by resistant heating, and when a shutter is opened at the vapor deposition, the vaporized organic compound is scattered in the direction of a substrate. The vaporized organic compound then flies upward, and is vapor deposited over the substrate through an opening provided on a metal mask.

For example, a white color can be obtained by laminating $Alq_3$, $Alq_3$ partially doped with Nile Red which is a red-color luminescent pigment, p-EtTAZ, and TPD (aromatic diamine) in order by vapor deposition.

Further, when a layer containing an organic compound is formed by coating using spin coating, it is preferable that the layer, after being applied, is baked by vacuum heating. For example, an aqueous solution of poly (ethylene dioxythiophene)/poly (styrene sulfonic acid) (referred to also as PEDOT/PSS) which will acts as a hole injection layer is applied on an entire surface of the substrate, and baked. On the resultant substrate, thereafter, a polyvinyl carbazole (referred to also as PVK) solution doped with a luminescence center pigment (for example, 1,1,4,4-tetraphenyl-1,3-butadiene(TPB), 4-dicyanomethylene-2-methyl-6-(p-dimethylamino-styryl)-4H-pyran (DCM 1), Nile Red, or coumarin 6) which will act as a light emitting layer may be applied, and then, baked. Further, PEDOT/PSS uses water as a solvent and is not soluble in an organic solvent. Therefore, when PVK is applied thereover, there is no fear of being dissolved again. Since PEDOT/PSS and PVK employ different solvents from each other, it is preferable that a same film-forming chamber is not shared. Still further, the layer 310 containing the organic compound can be prepared as a single layer, and a 1,3,4-oxadiazole derivative (PBD) having an electron transport property may be dispersed in polyvinyl carbazole (PVK) having a hole transport property. Furthermore, 30% by weight of PBD is dispersed therein as an electron transport agent and, then, an appropriate quantity of each of 4 types of pigments (TPB, coumarin 6, DCM 1, and Nile Red) is dispersed to obtain white luminescence.

Although an example of a light emitting element for obtaining white luminescence has been described above, it goes without saying that a light emitting element which can obtain red luminescence, green luminescence, or blue luminescence can be fabricated by appropriately selecting materials of the layer 310 containing the organic compound.

Reference numeral 311 denotes a second electrode comprising an electrically conductive layer, that is, a cathode (or anode) of a light emitting element. As for materials for the second electrode 311, an alloy selected from the group consisting of: MgAg, MgIn, AlLi, $CaF_2$, CaN, and the like, or a translucent film formed by using an element belonging to the group I or II in the periodic table, and aluminum by means of co-vapor deposition may be used. Since an top emission type in which light emission is performed by allowing luminescence to pass through the second electrode is adopted in the present Embodiment Mode, an aluminum film having a thickness of from 1 nm to 10 nm, or an aluminum film comprising a trace quantity of Li is used. In a constitution in which the aluminum film is used as the second electrode 311, it becomes possible to form a material adjacent to the layer 310 containing the organic compound by a material other than oxides whereupon reliability of the light emitting device can be improved. It is also permissible that a translucent layer (thickness being from 1 nm to 5 nm) comprising $CaF_2$, $MgF_2$, or $BaF_2$ may be also formed as a cathode buffer layer before the aluminum layer having a thickness of from 1 nm to 10 nm is formed.

For the purpose of reducing resistance of the cathode, the cathode 311 may have a laminate constitution comprising a metal thin film having a thickness of from 1 nm to 10 nm, and a transparent conductive layer (for example, indium oxide-tin oxide alloy (ITO), indium oxide-zinc oxide alloy ($In_2O_3$—ZnO), or zinc oxide (ZnO)). In another case, for the same purpose, an auxiliary electrode may be provided in a region which is not a light emitting region over the second electrode 311. Further, the cathode may be selectively formed by using vapor deposition mask by means of a resistance heating employing vapor deposition technique.

Reference numeral 312 denotes a transparent protective laminate to be formed by sputtering or vapor deposition and the layer becomes a sealing film which not only protects the second electrode 311 comprising a metal thin film but also prevents penetration of moisture. As shown in FIG. 1B, the transparent protective laminate 312 comprises a laminate comprising an inorganic insulating film 312a, a stress relaxing film 312b, and an inorganic insulating film 312c. As for the inorganic insulating film 312a, at least one film selected from the group consisting of: a silicon nitride film, a silicon oxide film, a silicon oxynitride film (SiNO film (component ratio: N>O), or SiON film (component ratio: N<O)), and a thin film containing carbon as a primary component (for example, DLC film, or CN film) which are obtained by sputtering or CVD can be used. These inorganic insulating films 312a each have a high blocking effect against moisture; however, as film thickness thereof is increased, a film stress is increased, and therein, they tend to be partially peeled or totally removed as a film. Nevertheless, stress can be relaxed and moisture can be absorbed by sandwiching the stress relaxing film 312b between the inorganic insulating film 312a and the inorganic insulating film 312c. Even when a minute hole (pinhole or the like) is formed in the inorganic insulating film 312a by an undefined reason, the minute hole can be blocked by the stress relaxing film 312b, and further, by providing the inorganic insulating film 312c thereover, an extremely high blocking effect against moisture or oxygen can be attained.

As for materials for the stress relaxing film 312b, a material which has smaller stress than the inorganic insulating films 312a and 312c and has a hygroscopic property is preferable. In addition to the above-described properties, a material having a translucent property is desirable. Further, as for the stress relaxing film 312b, a material film containing an organic compound such as α-NPD (4,4'-bis[N-(naphthyl)-N-phenyl-amino]biphenyl), BCP (bathocuproin), MTDATA (4,4',4''-tris(N-3-methylphenyl-N-phenyl-amino)triphenylamine), and $Alq_3$ (a tris-8-quinolinolate aluminum complex) may be used. These material films each have a hygroscopic property. Also, they are nearly transparent when they are thin in thickness. When they become thin in thickness, they become nearly transparent. Since MgO, $SrO_2$, and SrO each have a hygroscopic property and translucency and, also, a thin film thereof can be obtained by vapor deposition, any one of these oxides can be used as the stress relaxing film 312b.

Further, as for the stress relaxing film 312b, a same material used in a layer, containing an organic compound, which is sandwiched between the cathode and the anode can also be used.

In a case in which it is possible to form the inorganic insulating films 312a and 312c by sputtering (or CVD) and the stress relaxing film 312b by vapor deposition, a substrate is transported back and forth between a vapor-depositing chamber and a sputtering film-forming chamber (or CVD film-forming chamber) whereupon it is a merit that there is no need of providing another film-forming chamber. Although it is conceivable to use an organic resin film as the stress relaxing film, since the organic resin film contains a solvent, it is necessary to subject the organic resin film to a baking treatment, therefore, there are problems such as an increase of a number of production steps, contamination by a solvent component, damage by baking heat, and a necessity of degasification.

The thus-formed transparent protective laminate 312 is optimum as a sealing film of a light emitting element which comprises a light emitting layer containing an organic compound. Since the transparent protective laminate 312 has a hygroscopic property, it also functions as removing moisture.

The second sealing material 313 bonds the second substrate 314 and the first substrate 300. The first sealing material (not shown), which comprises a gap material for securing a space between the substrates, is arranged such that it surrounds the second sealing material 313. The second sealing material 313 is not particularly limited so long as it is translucent. As an illustrative example, an epoxy resin curable by an ultraviolet ray or by heat may be used. In the present Embodiment Mode, used is a high heat-resistant UV epoxy resin (2500 Clear; available from Electro-lite Corporation) having a refractive index of 1.50, a viscosity of 500 cps, a Shore-D hardness of 90, a tensile strength of 3000 psi, a Tg point of 150° C., a volume resistance of $1\times10^{15}$ Ω·cm, and an electric strength of 450 V/mil. It is possible to improve an entire light transmittance by filling a gap between a pair of substrates with the second sealing material 313 compared with a case in which the gap between the pair of substrates is a space (inert gas).

Embodiment Mode 2

Figure 2A:
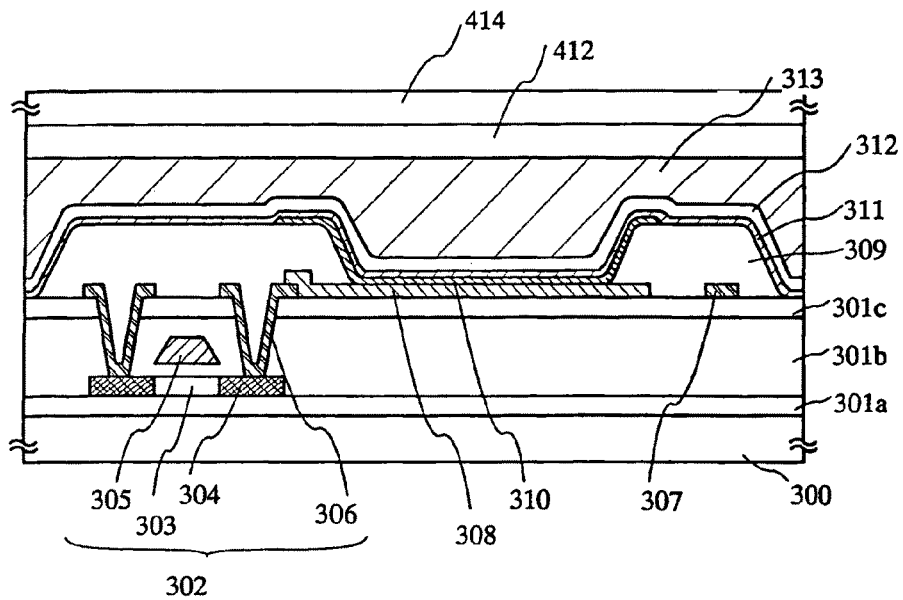
FIGS. 2A and 2B are cross-sectional views of Embodiment Mode 2, respectively.
Figure 2B:
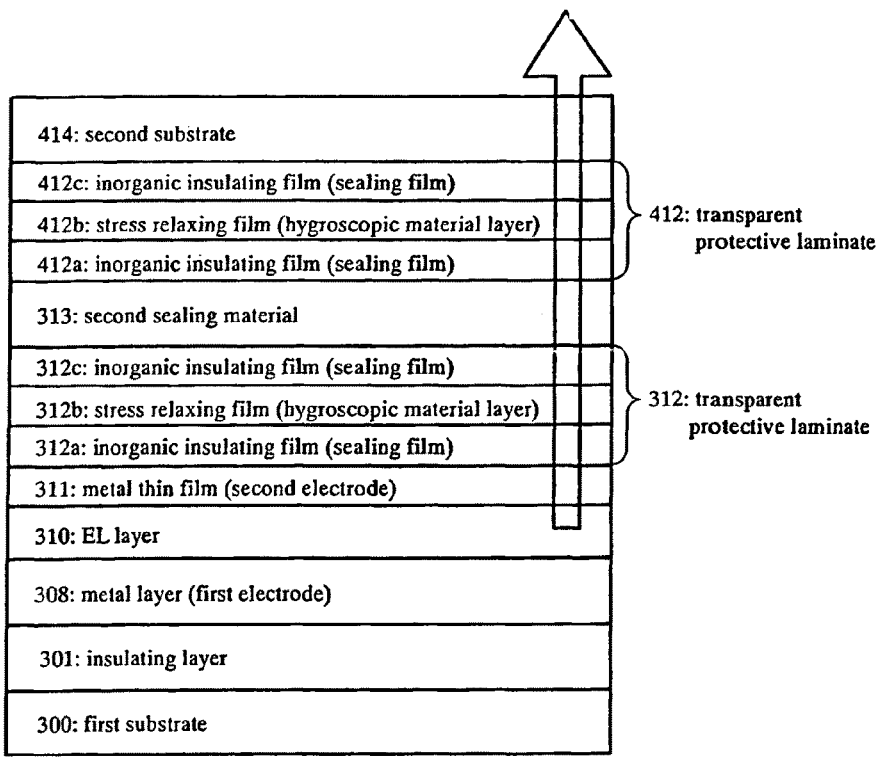

An example in which a plastic substrate is used as a second substrate and a transparent protective layer is provided over the substrate is shown in FIGS. 2A and 2B. Since the example shown in FIGS. 2A and 2B are constituted in a same manner as in FIGS. 1A and 1B except for the second substrate, same reference numerals are applied to parts identical to those in FIGS. 1A and 1B.

As for the second substrate 414, a plastic substrate comprising at least one member selected from the group consisting of: polyethylene terephthalate (PET), polyether sulfone (PES), polyethylene naphthalate (PEN), polycarbonate (PC), nylon, polyether etherketone (PEEK), polysulfone (PSF), polyether imide (PEI), polyallylate (PAR), polybutylene terephthalate (PBT), and polyimide may be used.

A transparent protective laminate 412 similar to the transparent protective laminate 312 as shown in Embodiment Mode 1 is formed over the second substrate 414.

The transparent protective laminate 412 is a transparent protective laminate which is formed by sputtering or vapor deposition and becomes a sealing film for preventing penetration of moisture. As shown in FIG. 2B, the transparent protective laminate 412 is a laminate comprising an inorganic insulating film 412c, a stress relaxing film 412b, and an inorganic insulating film 412a. As for the inorganic insulating film 412c, at least one film selected from the group consisting of: a silicon nitride film, a silicon oxide film, a silicon oxynitride film (SiNO film (component ratio: N>O), or SiON film (component ratio: N<O)) and a thin film containing carbon as a primary component (for example, DLC film, or CN film) which are obtained by sputtering or CVD can be used. These inorganic insulating films each have a high blocking effect against moisture; however, as film thickness thereof is increased, a film stress is increased, then they tend to be partially peeled or totally removed as a film. Nevertheless, stress can be relaxed and, also, moisture can be absorbed by sandwiching the stress relaxing film 412b between the inorganic insulating film 412a and the inorganic insulating film 412c. Even when a minute hole (pinhole or the like) is formed in the inorganic insulating film 412c by an undefined reason, the minute hole can be blocked by the stress relaxing film 412b and, further, by providing the inorganic insulating film 412a thereover, an extremely high blocking effect against moisture or oxygen can be attained.

As for materials for the stress relaxing film 412b, a material which has smaller stress than the inorganic insulating films 412a and 412c and has a hygroscopic property is preferable. In addition to the above-described properties a material having a translucent property is desirable. Further, as for the stress relaxing film 412b, a material film containing an organic compound such as α-NPD (4,4'-bis[N-(naphthyl)-N-phenyl-amino]biphenyl), BCP (bathocuproin), MTDATA (4,4',4''-tris(N-3-methylphenyl-N-phenyl-amino)triphenylamine), and $Alq_3$ (a tris-8-quinolinolate aluminum complex) may be used. These material films each have a hygroscopic property. Also, they are nearly transparent when they are thin in thickness. Since MgO, $SrO_2$, and SrO each have a hygroscopic property and translucency, and also, a thin film thereof can be obtained by vapor deposition, any one of these oxides can be used as the stress relaxing film 412b.

The second substrate 414 on which the transparent protective laminate 412 is thus formed is optimum as a sealed substrate of a light emitting element which comprises a light emitting layer containing an organic compound. Since the transparent protective laminate 412 has a hygroscopic property, it also functions as removing moisture.

Embodiment Mode 3

A bottom emission type light emitting device according to the present invention will be described with reference to FIGS. 3A and 3B.

Figure 3A:
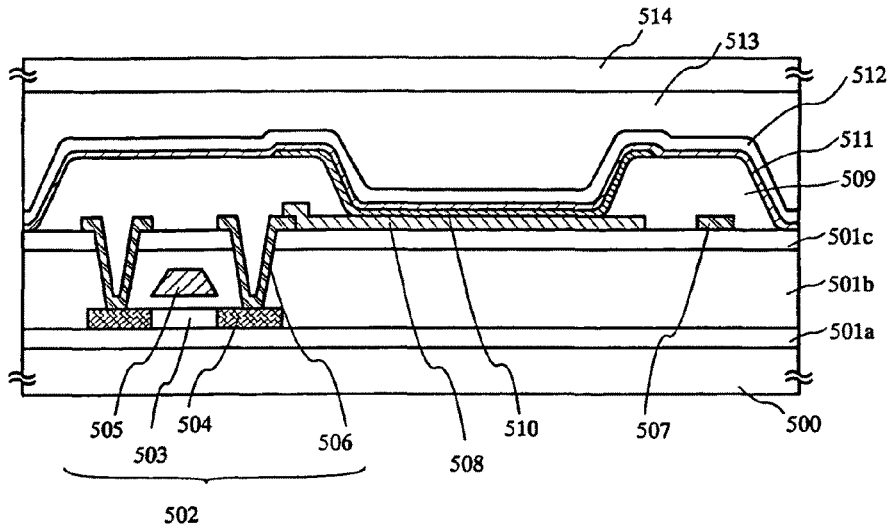
FIGS. 3A and 3B are cross-sectional views of Embodiment Mode 3, respectively.
Figure 3B:
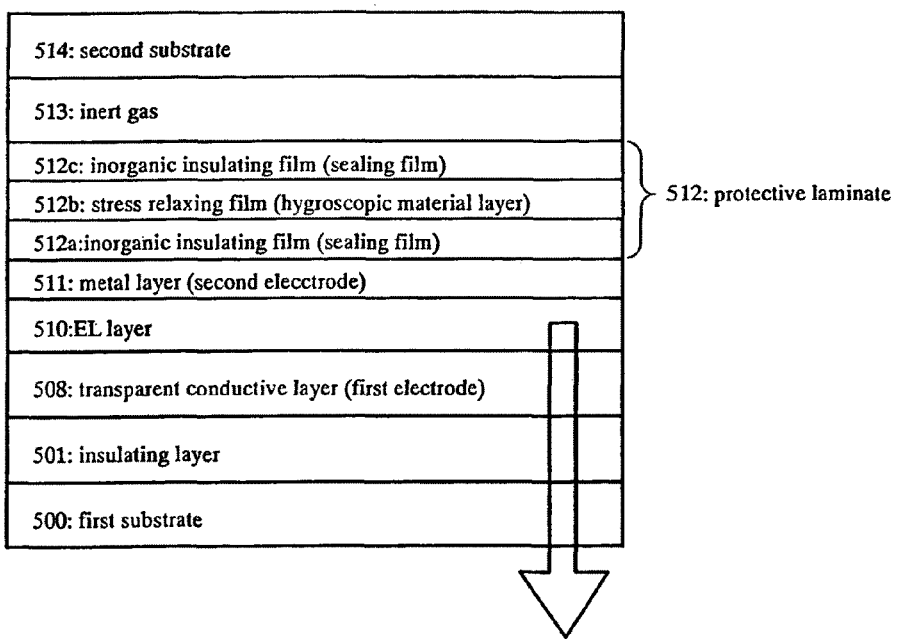

FIG. 3A is a view showing a cross-section of a part of a pixel portion. Further, FIG. 3B is a simplified view of a laminate constitution in a light emitting region whereupon luminescence is discharged in a direction which an arrow indicates.

In FIG. 3A, reference numeral 500 denotes a first substrate; reference numerals 501a, 501b, and 501c each designate an insulating layer; reference numeral 502 denotes a TFT; reference numeral 508 denotes a first electrode; reference numeral 509 denotes an insulating material; reference numeral 510 denotes an EL layer; reference numeral 511 denotes a second electrode; reference numeral 512 denotes a protective laminate; reference numeral 513 denotes a space (inert gas); and reference numeral 514 denotes a second substrate.

The TFT 502 (p-channel type TFT) provided over the first substrate 500 is an element which controls an electric current flowing into a EL layer 510. Further, reference numeral 504 denotes a drain region (or a source region); and reference numeral 506 denotes a drain electrode (or a source electrode) which connects the first electrode to the drain region (or the source region). Still further, in a same process as in the drain electrode 506, a wiring 507 such as a power supply wiring and a source wiring is simultaneously formed. An example in which the first electrode and the drain electrode are separately formed is shown in the present Embodiment Mode; however, these electrodes may be a same one. An insulating layer 501a to be an undercoat insulating film (a lower layer thereof and an upper layer thereof are herein referred to as a nitride insulating film and an oxidized insulating film, respectively) is formed over the first substrate 500, while a gate insulating film is provided between a gate electrode 505 and an active layer. Further, reference numeral 501b denotes an interlayer insulating film comprising an organic material or an inorganic material, while reference numeral 501c denotes an interlayer insulating film comprising an inorganic insulating film. Still further, although not shown here, another TFT (n-channel type TFT or p-channel type TFT) or a plurality of TFTs are provided per pixel. Furthermore, TFT having one channel-forming region 503 is shown in the present Embodiment Mode; however, TFT is not limited to this type and TFT may have a plurality of channels.

Reference numeral 508 denotes the first electrode, that is, an anode (or a cathode) of a light emitting element. As for materials for the first electrode 508, a transparent electrically conductive film (for example, an indium oxide-tin oxide alloy (ITO), an indium oxide-zinc oxide alloy ($In_2O_3$—ZnO), or zinc oxide (ZnO)) may be used.

Further, an insulating material 509 (referred to also as a bank, a partition, a barrier, a mound or the like) which covers an edge portion of the first electrode 508 (and wiring 507) is provided.

The layer 510 containing an organic compound is formed by vapor deposition or coating.

For example, a green color can be obtained by laminating CuPc (20 nm), α-NPD (60 nm), $Alq_3$ doped with DMQA (37.5 nm), and $Alq_3$ (37.5 nm) in order by vapor deposition.

Reference numeral 511 denotes a second electrode comprising an conductive film, that is, a cathode (or anode) of a light emitting element. As for materials for the second electrode 511, an alloy selected from the group consisting of: MgAg, MgIn, AlLi, $CaF_2$, CaN, and the like, or a film formed by using an element belonging to the group I or II in the periodic table and aluminum by means of co-vapor deposition may be used.

Reference numeral 512 denotes a protective laminate to be formed by sputtering or vapor deposition and the layer becomes a sealing film which not only protects the second electrode 511 comprising a metal film but also prevents penetration of moisture. Different from Embodiment Mode 1, since Embodiment Mode 2 is a bottom emission type, the protective laminate 512 is not necessarily transparent. As shown in FIG. 3B, the protective laminate 512 comprises a laminate comprising an inorganic insulating film 512a, a stress relaxing film 512b, and an inorganic insulating film 512c. As for the inorganic insulating film 512a, at least one film selected from the group consisting of: a silicon nitride film, a silicon oxide film, a silicon oxynitride film (SiNO film (component ratio: N>O), or SiON film (component ratio: N<O)), and a thin film containing carbon as a primary component (for example, DLC film, or CN film) which are obtained by sputtering or CVD can be used. These inorganic insulating films 512a each have a high blocking effect against moisture; however, as film thickness thereof is increased, a film stress is increased, and therein, they tend to be partially peeled or totally removed as a film. Nevertheless, stress can be relaxed, and moisture can be absorbed by sandwiching the stress relaxing film 512b between the inorganic insulating film 512a and the inorganic insulating film 512c. Even when a minute hole (pinhole or the like) is formed in the inorganic insulating film 512a by an undefined reason, the minute hole can be blocked by the stress relaxing film 512b, and further, by providing the inorganic insulating film 512c thereover, an extremely high blocking effect against moisture or oxygen can be attained.

As for materials for the stress relaxing film 512b, a material which has smaller stress than the inorganic insulating films 512a and 512c and has a hygroscopic property is preferable. As for the stress relaxing film 512b, a material film containing an organic compound such as α-NPD (4,4'-bis[N-(naphthyl)-N-phenyl-amino]biphenyl), BCP (bathocuproin), MTDATA (4,4',4"-tris(N-3-methylphenyl-N-phenyl-amino) triphenylamine), and Alq$_3$ (a tris-8-quinolinolate aluminum complex) may be used. Since MgO, SrO$_2$, and SrO each have a hygroscopic property and a thin film thereof can be obtained by vapor deposition, any one of these oxides can be used as the stress relaxing film 512b.

Further, as for the stress relaxing film 512b, a same material used in a layer containing an organic compound, which is sandwiched between the cathode and the anode can also be used.

In a case in which it is possible to form the inorganic insulating films 512a and 512c by sputtering (or CVD) and the stress relaxing film 512b by vapor deposition, a substrate is transported back and forth between a vapor-depositing chamber and a sputtering film-forming chamber (or CVD film-forming chamber) whereupon it is a merit that there is no need of providing another film-forming chamber. Although it is conceivable to use an organic resin film as the stress relaxing film, since the organic resin film contains a solvent, it is necessary to subject the organic resin film to a baking treatment, therefore, there are problems such as an increase of a number of production steps, contamination by a solvent component, damage by baking heat, and a necessity of degasification.

The thus-formed protective laminate 512 is optimum as a sealing film of a light emitting element which comprises a light emitting layer containing an organic compound. Since the protective laminate 512 has a hygroscopic property, it also functions as removing moisture.

The sealing material (not shown), comprising a gap material for securing a space between the substrates, bonds the second substrate 514 to the first substrate 500. Further, in a space between the pair of substrates is filled with an inert gas (for example, nitrogen gas). Still further, a desiccant may optionally be arranged over the second substrate for removing a trace quantity of moisture in the space 513.

Embodiments

Embodiment 1

Figure 4A:
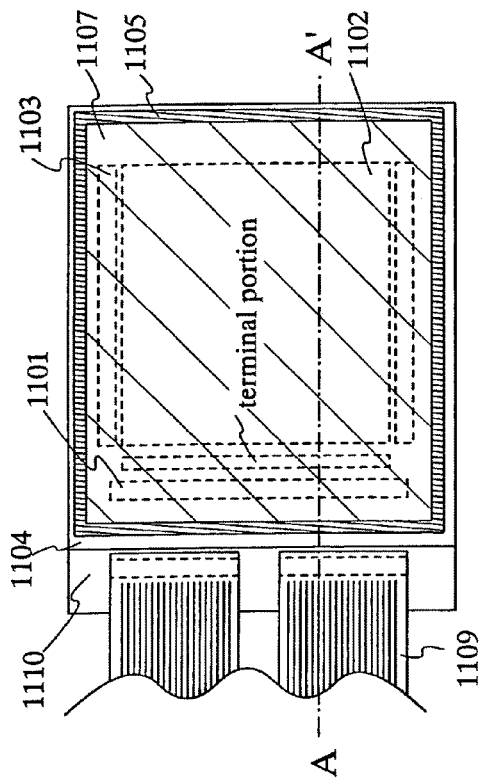
FIGS. 4A and 4B are a top view and a cross-sectional view of Embodiment 1, respectively.

In FIG. 4A, shown is an example of manufacturing a light emitting device (having an top emission constitution) provided over a substrate having an insulating surface with a light emitting element in which an organic compound layer is allowed to be a light emitting layer.

Figure 4B:
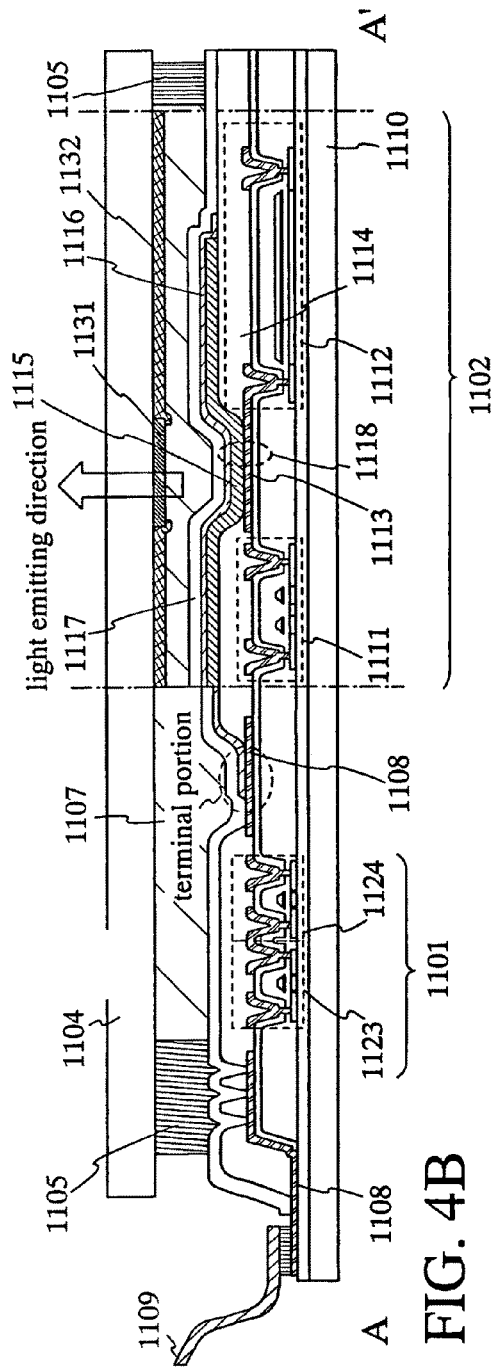

FIG. 4A is a top view of the light emitting device, while FIG. 4B is a cross-sectional view taken along a line A-A' in FIG. 4A. Reference numeral 1101 indicated by a dotted line denotes a source signal line driver circuit; reference numeral 1102 denotes a pixel portion; and reference numeral 1103 denotes a gate signal line driver circuit. Further, reference numeral 1104 denotes a transparent sealed substrate; reference numeral 1105 denotes a first sealing material; and reference numeral 1107 denotes a transparent second sealing material which fills an inside of an area surrounded by the first sealing material 1105. The first sealing material 1105 contains a gap material for securing a space between substrates.

Reference number 1108 denotes a wiring for transmitting a signal to be inputted to the source signal line driver circuit 1101 and the gate signal line driver circuit 1103. The wiring 1108 receives a video signal or a clock signal from a flexible print circuit (FPC) 1109 which becomes an external input terminal. Although only the FPC 1109 is shown, a printed wiring board (PWB) may be attached to the FPC 1109.

Subsequently, a sectional constitution will be described with reference to FIG. 4B. A driver circuit and a pixel portion are formed over a substrate 1110, but the source signal line driver circuit 1101 as the driver circuit and the pixel portion 1102 are shown in FIG. 4B.

In the source signal line driver circuit 1101, a CMOS circuit in which an n-channel type TFT 1123 and a p-channel type TFT 1124 are combined is formed. The TFT which constitutes the driver circuit may be formed by at least one circuit selected from the group consisting of: a CMOS circuit, a PMOS circuit and an NMOS circuit which are publicly known in the art. In the present embodiment, a driver-integrated type in which the driver circuit is formed over the substrate is shown, but the driver-integrated type may not necessarily be adopted. The driver circuit can also be formed outside instead of being formed over the substrate. A constitution of the TFT using a polysilicon film as an active layer is not particularly limited thereto, either a top gate type TFT or a bottom gate type TFT is permissible.

The pixel portion 1102 is formed by a plurality of pixels each of which comprises a switching TFT 1111, a current-controlling TFT 1112 and a first electrode (anode) 1113 which is electrically connected to the drain of the current-controlling TFT 1112. The current-controlling TFT 1112 may either be an n-channel type TFT or a p-channel type TFT, but when it is to be connected to the anode, it is preferably the p-channel type TFT. It is also preferable that a storage capacitor (not shown) is appropriately provided. An example in which only a cross-sectional constitution of one pixel is shown where two TFTs are used in the pixel is illustrated, but three or more TFTs may appropriately be used per pixel.

Since it is constituted such that the first electrode 1113 is directly connected to the drain of the TFT 1112, it is preferable that a lower layer of the first electrode 1113 is allowed to be a material layer which can have an ohmic contact with the drain comprising silicon, while an uppermost layer thereof which contacts a layer containing an organic compound is allowed to be a material layer which has a large work function. For example, a three-layer constitution contained of a titanium nitride film, a film containing aluminum as a primary component, and a titanium nitride film, can have a low resistance of wiring, a favorable ohmic contact, and also, can function as an anode. Further, as the first electrode 1113, a monolayer of at least one film selected from the group consisting of: a titanium nitride film, a chromium film, a tungsten film, a zinc film, a platinum film and the like, or a laminate of three layers or more may be used.

An insulating substance 1114 (referred to as a bank, a partition, a barrier, a mound or the like) is formed over each end of the first electrode (anode) 1113. The insulating substance 1114 may be formed by either an organic resin film or an insulating film comprising silicon. In the present embodiment, as for the insulating substance 1114, an insulating substance is formed in a shape as shown in FIG. 4B by using a positive type photosensitive acrylic resin film.

For the purpose of enhancing a coverage effect, a curved surface having a curvature is to be formed in an upper end portion or a lower end portion of the insulating substance 1114. For example, when the positive type photosensitive acrylic resin is used as a material for the insulating substance 1114, it is preferable that a curved face having a curvature radius (0.2 μm to 3 μm) is provided only to the upper end portion of the insulating substance 1114. As for the insulating substance 1114, either one of a negative type which becomes insoluble to an etchant by photosensitive light, and a positive type which becomes soluble to the etchant by the light can be used.

Further, the insulating substance 1114 may be covered by a protective film comprising at least one film selected from the group consisting of: an aluminum nitride film, an aluminum oxynitride film, a thin film containing carbon as a primary component, and a silicon nitride film.

A layer 1115 containing an organic compound is selectively formed over the first electrode (anode) 1113 by vapor deposition using vapor mask or inkjet. Further, a second electrode (cathode) 1116 is formed over the layer 1115 containing the organic compound. As for the cathode, a material having a small work function (for example Al, Ag, Li, Ca, alloys of thereof, that is, MgAg, MgIn, AlLi, $CaF_2$, or CaN) may be used. In the present embodiment, in order to allow luminescence to pass through, as for the second electrode (cathode) 1116, a laminate of a metal thin film which is thin in thickness, and a transparent conductive film (for example, an indium oxide-tin oxide alloy (ITO), an indium oxide-zinc oxide alloy ($In_2O_3$—ZnO), or zinc oxide (ZnO)) is used. Then, a light emitting element 1118 comprising the first electrode (anode) 1113, the layer 1115 containing the organic compound, and the second electrode (cathode) 1116 is fabricated. In the present embodiment, the light emitting element 1118 is allowed to be an example of emitting white light, and therein, a color filter (for the purpose of simplicity, an overcoat layer is not shown) comprising a colored layer 1131 and a light blocking layer (BM) 1132 is provided.

Further, when layers each containing an organic compound which can obtain R, G, and B luminescence respectively, are selectively formed, a full-color display can be obtained without using a color filter.

A transparent protective layer 1117 is formed in order to seal the light emitting element 1118. As for the transparent protective layer 1117, the transparent protective laminate shown in Embodiment Mode 1 can be adopted. The transparent protective laminate comprises a laminate comprising a first inorganic insulating film, a stress relaxing film and a second inorganic insulating film. As for each of the first and second inorganic insulating films, at least one film selected from the group consisting of: a silicon nitride film, a silicon oxide film, a silicon oxynitride film (SiNO film (component ratio: N>O), or SiON film (component ratio: N<O)), and a thin film containing carbon as a primary component (for example, DLC film, or CN film) which are obtained by sputtering or CVD can be used. These inorganic insulating films each have a high blocking effect against moisture; however, as film thickness thereof is increased, a film stress is increased, then, they tend to be partially peeled or totally removed as a film. Nevertheless, stress can be relaxed and, also, moisture can be absorbed by sandwiching the stress relaxing film between the first inorganic insulating film and the second inorganic insulating film. Even when a minute hole (pinhole or the like) is formed in the first inorganic insulating film by an undefined reason, the minute hole can be blocked by the stress relaxing film and, further, by providing the second inorganic insulating film thereover, an extremely high blocking effect against moisture or oxygen can be attained. As for materials for the stress relaxing film, a material which has smaller stress than the inorganic insulating films and has a hygroscopic property is preferable. In addition to the above-described properties, a material having a translucent property is desirable. Further, as for the stress relaxing film, a material film containing an organic compound such as α-NPD (4,4'-bis[N-(naphthyl)-N-phenyl-amino]biphenyl), BCP (bathocuproin), MTDATA (4,4',4"-tris(N-3-methylphenyl-N-phenyl-amino)triphenylamine, and $Alq_3$ (a tris-8-quinolinolate aluminum complex) may be used. These material films each have a hygroscopic property. When they are thin in thickness, they become nearly transparent. Since MgO, $SrO_2$, and SrO each have a hygroscopic property and translucency, and also, a thin film thereof can be obtained by vapor deposition, any one of these oxides can be used as the stress relaxing film. In the present embodiment, a silicon target is used, a film formed in an atmosphere containing a nitrogen gas and an argon gas, that is, a silicon nitride film having a high blocking effect against impurities such as moisture, and an alkali metal is used as the first inorganic insulating film or the second inorganic insulating film, and a thin film of $Alq_3$ formed by vapor deposition is used as the stress relaxing film. Further, in order to allow luminescence to penetrate the transparent protective laminate, it is preferable that an entire film thickness of the transparent protective laminate is formed as thin as possible.

Further, in order to seal the light emitting element 1118, the sealed substrate 1104 is bonded thereto by using the first sealing material 1105 and the second sealing material 1107 in an inert gas atmosphere. As for the first sealing material 1105 and the second sealing material 1107, it is preferable that an epoxy resin is used. It is also preferable that the first sealing material and the second sealing material are each made of a material which does not allow moisture or oxygen to penetrate thereinto as much as possible.

Further, in the present embodiment, a plastic substrate comprising at least one member consisting of: fiberglass-reinforced plastics (FRP), polyvinylfluoride (PVF), Mylar, polyester, an acrylic resin, and the like, other than a glass substrate or a quartz substrate can be used as a material which constitutes the sealed substrate 1104. After the sealed substrate 1104 was bonded by using the first sealing material 1105 and the second sealing material 1107, it is possible to perform sealing by using a third sealing material such that a side face (exposed face) is covered.

By sealing the light emitting element by using the transparent protective layer 1117, the first sealing material 1105, and the second sealing material 1107 as described above, the light emitting element can thoroughly be shielded from outside. In consequence, substance, such as moisture and oxygen, which will deteriorate the organic compound layer can be prevented from entering from outside. Accordingly, a light emitting device having high reliability can be obtained.

Further, as for the first electrode 1113, a both-side emission type light emitting device can be prepared by using a transparent conductive film.

In the present embodiment, an example of a constitution (hereinafter, referred top emission constitution) in which a layer containing an organic compound is formed over an anode and a cathode which is a transparent electrode is formed over the layer containing the organic compound was shown; however, a constitution having a light emitting element (hereinafter, bottom emission constitution) in which an organic compound is formed over an anode and a cathode is formed over the organic compound, and then luminescence generated in the layer containing the organic compound is drawn from the anode which is a transparent electrode to TFT, may also be permissible.

Figure 5A:
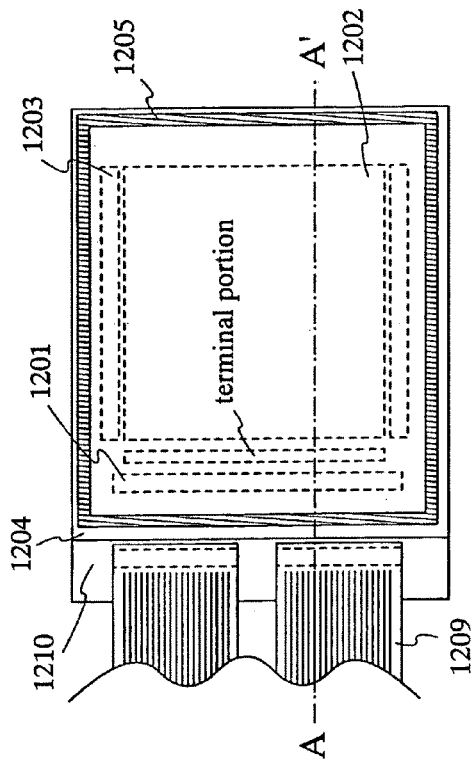
FIGS. 5A and 5B are a top view and a cross-sectional view of Embodiment 1, respectively.
Figure 5B:
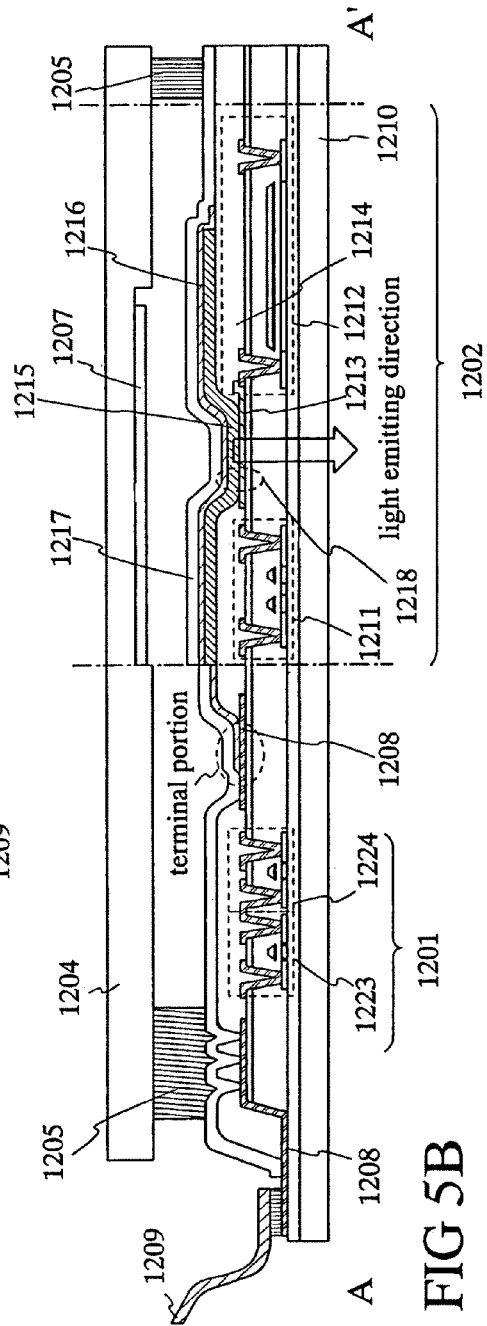

An example of a light emitting device having a bottom emission constitution is shown in FIGS. 5A and 5B.

FIG. 5A is a top view of the light emitting device, while FIG. 5B is a cross-sectional view taken along a line A-A' in FIG. 5A. Reference numeral 1201 indicated by a dotted line denotes a source signal line driver circuit; reference numeral 1202 denotes a pixel portion; and reference numeral 1203 denotes a gate signal line driver circuit. Further, reference numeral 1204 denotes a sealed substrate; reference numeral 1205 denotes a sealing material in which a gap material for securing a sealed space is contained; and an inside of an area surrounded by the sealing material 1205 is filled with an inert gas (illustratively, a nitrogen gas). A trace quantity of moisture present in the space inside the area surrounded by the sealing material 1205 is removed by a desiccant 1207 and, accordingly, the space is sufficiently dry.

Reference number 1208 denotes a wiring for transmitting a signal to be inputted to the source signal line driver circuit 1201 and the gate signal line driver circuit 1203. The wiring 1208 receives a video signal or a clock signal from a flexible print circuit (FPC) 1209 which becomes an external input terminal.

Subsequently, a sectional constitution will be described with reference to FIG. 5B. A driver circuit and a pixel portion are formed on a substrate 1210, but the source signal line driver circuit 1201 as the driver circuit and the pixel portion 1202 are shown in FIG. 5B. In the source signal line driver circuit 1201, a CMOS circuit in which an n-channel type TFT 1223 and a p-channel type TFT 1224 are combined is formed.

The pixel portion 1202 is formed by a plurality of pixels each of which comprises a switching TFT 1211, a current-controlling TFT 1212 and a first electrode (anode) 1213 comprising a transparent conductive film which is electrically connected to a drain of the current-controlling TFT 1212.

In the present embodiment, it is constituted such that the first electrode 1213 is formed such that a part thereof is overlapped with a connecting electrode and the first electrode 1213 is electrically connected to a drain region of the TFT 1212 via a connecting electrode. It is preferable that the first electrode 1213 has transparency and comprises an electrically conductive film having a large work function (for example, an indium oxide-tin oxide alloy (ITO), an indium oxide-zinc oxide alloy ($In_2O_3$—ZnO), or zinc oxide (ZnO)).

An insulating substance 1214 (referred to as a bank, a partition, a barrier, a mound or the like) is formed over each end of the first electrode (anode) 1213. For the purpose of enhancing a coverage effect, a curved surface having a curvature is allowed to be formed in an upper end portion or a lower end portion of the insulating substance 1214. Further, the insulating substance 1214 may be covered by a protective film comprising at least one film selected from the group consisting of: an aluminum nitride film, an aluminum oxynitride film, a thin film containing carbon as a primary component, and a silicon nitride film.

A layer 1215 containing an organic compound is selectively formed over the first electrode (anode) 1213 by vapor deposition using a vapor deposition mask or inkjetting. Further, a second electrode (cathode) 1216 is formed over the layer 1215 containing the organic compound. As for the cathode, a material having a small work function (for example Al, Ag, Li, Ca, alloys of thereof, that is, MgAg, MgIn, AlLi, $CaF_2$, or CaN) may be used. Then, a light emitting element 1218 comprising the first electrode (anode) 1213, the layer 1215 containing the organic compound, and the second electrode (cathode) 1216 is fabricated. The light emitting element 1218 emits light in a direction which an arrow in FIG. 5B indicates. The light emitting element 1218 in the present embodiment is one type of light emitting element which can obtain mono-color luminescence of R, G, or B. Three of such light emitting elements as described above, in each of which a layer containing an organic compound capable of obtaining one of R, G, and B luminescence is selectively formed, are combined to obtain full-color luminescence.

Further, a protective layer 1217 is formed in order to seal the light emitting element 1218. As for the protective layer 1217, the protective laminate shown in Embodiment Mode 2 can be adopted. The protective laminate comprises a laminate comprising a first inorganic insulating film, a stress relaxing film and a second inorganic insulating film.

Further, in order to seal the light emitting element 1218, the sealed substrate 1204 is bonded thereto by using the sealing material 1205 in an inert gas atmosphere. A concave portion has previously been formed over the sealed substrate 1204 by sandblasting or the like and, then, a desiccant 1207 is bonded to the thus-formed concave portion. As for the sealing material 1205, it is preferable that an epoxy resin is used. It is also preferable that the sealing material 1205 is composed of a material which does not penetrate moisture or oxygen as much as possible.

Further, in the present embodiment, a plastic substrate comprising at least one member selected from the group consisting of: fiberglass-reinforced plastics (FRP), polyvinyl fluoride (PVF), Mylar, polyester, an acrylic resin, and the like, other than a metal substrate, a glass substrate or a quartz substrate can be used as a material which constitutes the sealed substrate 1204 having the recess portion. It is also possible to perform sealing by using a metal can in which a desiccant is bonded to an inside thereof Further, the present embodiment can freely be combined with any one of Embodiment Modes 1 to 3.

Embodiment 2

In the present embodiment, an example of a manufacturing apparatus of a multi-chamber method, in which an entire process from vapor deposition over a first electrode to sealing is automated, is described with reference to FIG. 6.

Figure 6:
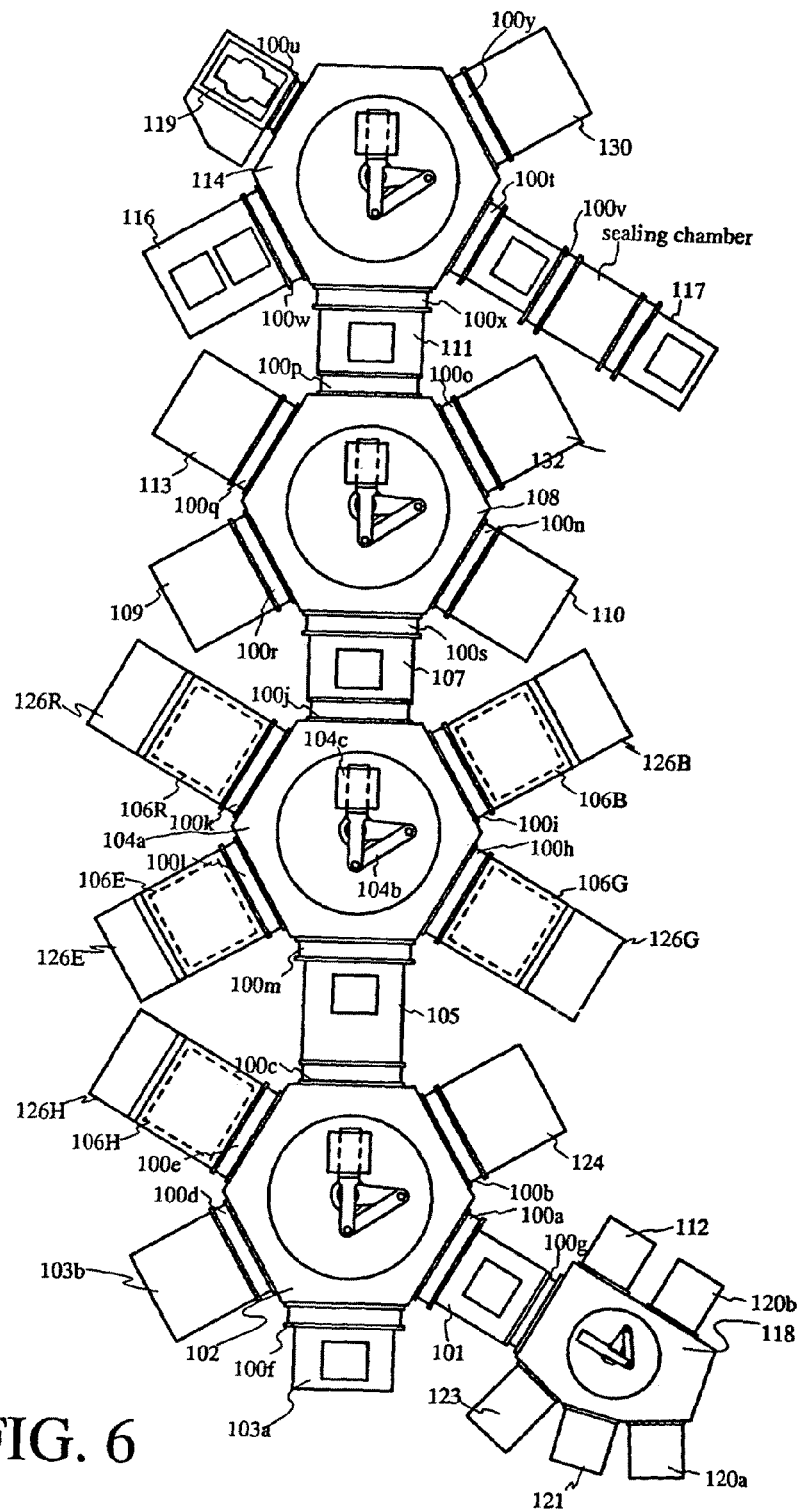
FIG. 6 shows a schematic diagram of a manufacturing apparatus according to Embodiment 2.

FIG. 6 is a multi-chamber manufacturing apparatus that includes: gates 100a to 100y; transport chambers 102, 104a, 108, 114, and 118; delivery chambers 105, 107, and 111; a load chamber 101; a first film-forming chamber 106H (EL layer: HTL, HIL); a second film-forming chamber 106B (EL layer: B); a third film-forming chamber 106G (EL layer: G); a fourth film-forming chamber 106R (EL layer: R); a fifth film-forming chamber 106E (EL layer: E); other film-forming chambers 109 (ITO or IZO film), 110 (metal film), 112 (spin coat or ink jet), 113 (SiN film or $SiO_x$ film), and 132 (deposition of a layer containing an organic compound), a setting chambers 126R, 126G, 126B, 126E, and 126H in each of which vapor deposition source is set; pretreatment chambers 103a (bake or $O_2$ plasma, $H_2$ plasma, Ar plasma) and 103b (vacuum bake); a sealing chamber 116; a mask stock chamber 124; a sealed substrate storage chamber 130; a cassette chambers 120a and 120b, a tray attachment stage 121; and a extraction chamber 119. In the transport chamber 104a, a transport mechanism 104b is provided for transport a substrate 104c and in other transport chambers, respective transport mechanisms are also provided.

Hereinafter, a process comprising a step of bringing a substrate over which an anode (first electrode), and an insulating substance (partition) that covers an end portion of the anode have previously been provided in a manufacturing apparatus as shown in FIG. 6 and a step of fabricating a light emitting device is described. When an active matrix type light emitting device is manufactured, a thin film transistor (current-controlling TFT) which is connected to an anode, a plurality of other thin film transistors (for example, switching TFT) and a driver circuit comprising another thin film transistor have previously been provided over a substrate. Even when a passive matrix type light emitting device is manufactured, the device can be manufactured by using the manufacturing apparatus as shown in FIG. 6.

Firstly, the above-described substrate is set in the cassette chamber 120a or the cassette chamber 120b. When the substrate is large in size (for example, 300 mm×360 mm), it is set in cassette chamber 120b, while, when the substrate is of an normal size (for example, 127 mm×127 mm), it is set in the cassette chamber 120a, and then, the thus-set substrate is transported into the tray loading stage 121 where a plurality of substrates are set on a tray (for example, 300 mm×360 mm).

The substrates (over which an anode and an insulating substance that covers an end portion of the anode are formed) set in either of the cassette chambers are, then, transported to the transport chamber 118.

Before the substrates are set in either of the cassette chambers, in order to reduce a spot defect, it is preferable that a surface of the first electrode (anode) is cleaned by using a porous sponge (for example, being made of polyvinyl alcohol (PVA), or nylon) impregnated with a surfactant (being alkalescent), thereby removing dust from a surface thereof. As for a cleaning mechanism, a cleaning apparatus having a roll brush (for example, made of PVA) which contacts a face of a substrate such that the roll brush rotates around an axis line parallel to the face of the substrate may be used, or another cleaning apparatus having a disk brush (for example, made of PVA) which contacts a face of a substrate such that the disk brush rotates around an axis line vertical to the face of the substrate may be used. Further, before a film containing an organic compound is formed, in order to remove moisture or other gases contained in the substrate, it is preferable that annealing for degasification is performed on the substrate under vacuum. The substrate is transported into a bake chamber (a pretreatment chamber) 123 connected to the transport chamber 118, and then, such annealing may be performed in the bake chamber 123.

Subsequently, the resultant substrate is transported from the transport chamber 118, which is provided with a substrate transport mechanism, into the load chamber 101. In the manufacturing apparatus according to the present embodiment, the load chamber 101 is provided with a substrate reversal mechanism which can appropriately reverse the substrate. The load chamber 101 is connected to a vacuum-evacuation treatment chamber. It is preferable that, after the load chamber 101 is evacuated to a vacuum state, it allows an inert gas to be introduced thereinto, thereby being at an atmospheric pressure.

Subsequently, the resultant substrate is transported into the transport chamber 102 connected to the load chamber 101. It is preferable that, in order to allow an inside of the transport chamber 102 to be free from moisture or oxygen as much as possible, the inside thereof is evacuated to a vacuum state such that the vacuum state is maintained.

Further, the vacuum-evacuation treatment chamber is provided with a magnetically floating type turbo-molecular pump, a cryosorption pump, or a drypump. In such constitution, an ultimate vacuum degree in the transport chamber 102 connected to the load chamber 101 is allowed to be in the range of from $10^{-5}$ Pa to $10^{-6}$ Pa, and further, back diffusion of impurities from a pump side and an exhaust system can be controlled. In order to prevent the impurities from being introduced into inside the apparatus, as for a gas to be introduced, an inert gas, for example, a nitrogen gas, or a noble gas is used. Any one of these gases to be introduced into the apparatus is highly purified by a gas purifier before it is introduced into inside the apparatus, and then, used. Accordingly, it is necessary to provide the gas purifier such that the gas is firstly highly purified, and then, introduced into inside the vapor deposition apparatus. Under such constitution, since oxygen, moisture, or any other impurities contained in the gas can be removed in advance, these impurities can be prevented from being introduced into inside the apparatus.

Further, when it is desired that a film containing an organic compound formed in an unnecessary part is removed, the resultant substrate is transported into the pretreatment chamber 103a where the film containing the organic compound, then, may selectively be removed. The pretreatment chamber 103a is provided with a plasma-generating device in which a gas or a plurality of gases of at least one element selected from the group consisting of: Ar, H, F, and O are excited to generate plasma, and then, dry etching is performed by the thus-generated plasma. Further, a UV irradiation mechanism may be provided in the pretreatment chamber 103a such that an ultraviolet ray irradiation can be executed to perform an anode surface treatment.

In order to be free from shrinkage, it is preferable that vacuum heating is performed immediately before a film containing an organic compound is formed by vapor deposition.

The resultant substrate is transported into the pretreatment chamber 103b where, in order to thoroughly remove moisture, or any other gases contained in the substrate, annealing for degasification is performed on the substrate under vacuum (a degree thereof being $5\times10^{-3}$ Torr (0.665 Pa) or less and, preferably, in the range of from $10^{-4}$ Torr to $10^{-6}$ Torr). In the pretreatment chamber 103b, a plate heater (sheath heater as a typical example) is used to uniformly heat a plurality of substrates. Particularly, when an organic resin film is used as a material of an interlayer insulating film or a partition, an organic resin material tends to absorb moisture depending on a type thereof. Since there is a risk of degasification, it is effective to perform vacuum heating for removing absorbed moisture before a layer containing an organic compound is formed such that the organic resin material is heated at a temperature in the range of from 100° C. to 250° C., preferably in the range of from 150° C. to 200° C., for example, for 30 minutes or more, and then, the thus-heated organic resin material is left to stand in air for spontaneous cooling.

Subsequently, after the above-described vacuum heating, the resultant substrate is transported from the transport chamber 102 to the delivery chamber 105, and then, the substrate is transported without being exposed to air from the delivery chamber 105 to the transport chamber 104a.

Thereafter, the substrate is appropriately transported into each of the film-forming chambers 106R, 106G, 106B, and 106E each of which is connected to the transport chamber 104a. Over the thus-transported substrate, a low molecular weight organic compound layer which will become a hole injection layer, a hole transport layer, a light emitting layer, an electron transport layer, or an electron injection layer is appropriately formed. In another case, the substrate is transported from the transport chamber 102 to the film-forming chamber 106H where vapor deposition can, then, be performed over the thus-transported substrate.

Further, in the film-forming chamber 112, the hole injection layer comprising a polymer material may be formed by inkjetting or spin coating. Still further, the substrate is vertically placed and, then, film-forming is performed on the substrate under vacuum by inkjetting. Furthermore, at least one member selected from the group consisting of: an aqueous solution of poly(ethylene dioxythiophene)/poly(styrene sulfonic acid) (referred to also as PEDOT/PSS), an aqueous solution of polyaniline/camphor sulfonic acid (referred to also as PANI/CSA), PTPDES, Et-PTPDEK, and PPBA each of which acts as the hole injection layer (anode buffer layer) may be applied over an entire surface of the first electrode (anode) and baked. It is preferable that such baking is performed in the bake chamber 123. When the hole injection layer comprising a polymer material is formed by coating such as spin coating, a degree of flatness is improved whereby coverage and uniformity in thickness of a film to be formed thereon are allowed to be favorable. Particularly, since film thickness of the light emitting layer becomes uniform, a uniform luminescence can be obtained. In this case, it is preferable that, after the hole injection layer is formed by coating, vacuum heating (100° C. to 200° C.) is performed on the thus-formed hole injection layer immediately before film-forming is performed by vapor deposition. The vacuum heating may be performed in the pretreatment chamber 103b. For example, after a surface of the first electrode (anode) is cleaned by using a sponge, the substrate is transported into a cassette chamber, and then, the film-forming chamber 112. After the aqueous solution of poly(ethylene dioxythiophene)/poly(styrene sulfonic acid) (PEDOT/PSS) is applied on an entire surface of the first electrode (anode) with a film thickness of 60 nm, the resultant substrate is transported in to the bake chamber 123, pre-baked at 80° C. for 10 minutes, baked in a full scale at 200° C. for one hour and, thereafter, transported into the pretreatment chamber 103b. Furthermore, after vacuum heating (heating at 170° C. for 30 minutes followed by cooling for 30 minutes) is performed immediately before vapor deposition is performed, the resultant substrate transported sequentially into the film-forming chambers 106R, 106G, and 106B where respective light emitting layers may be formed by vapor deposition without exposing the substrate to air. Particularly, in a case in which, when an ITO film is used as a material for the anode, a surface thereof has an uneven contour or a minute particle is present on the surface thereof, such detrimental influences can be decreased by allowing a film thickness of PEDOT/PSS to be 30 nm or more.

Further, when PEDOT/PSS is applied on the ITO film, wettability thereof is not favorable; therefore, it is preferable that, after a PEDOT/PSS solution is applied at a first time by using spin coating, the resultant PEDOT/PSS is rinsed with pure water, thereby enhancing the wettability thereof, and then, the PEDOT/PSS solution is applied at a second time by using spin coating, and thereafter, baked to form a film favorable in uniformity. By rinsing the surface with pure water after a first application is performed, effects not only of changing a quality of the surface but also removing a minute particle or the like from the surface can be exerted.

Further, when a film of PEDOT/PSS is formed by using spin coating, the film is formed on an entire surface of the substrate. Therefore, the film formed on each of an end portion, a peripheral portion, a terminal portion, a connecting region between the cathode and a lower wiring and the like is preferably removed and, in this case, such removal is preferably performed in the pretreatment chamber 103a by means of $O_2$ ashing or the like.

Next, the film-forming chambers 106R, 106G, 106B, 106E, and 106H will be described below.

Each of the film-forming chambers 106R, 106G, 106B, 106E, and 106H is provided with a movable vapor deposition source holder. A plurality of such holders are prepared and appropriately provided with a plurality of container (crucibles) which have appropriately been filled with an EL material in a sealed manner. The substrate is set in a face down manner, a position alignment of a vapor deposition mask is performed by CCD or the like. Then, film-forming can selectively be performed by executing vapor deposition by means of a resistance heating. Further, the vapor deposition mask is stored in a mask stock chamber 124 and it is properly transported from there to a film-forming chamber. Still further, the film-forming chamber 132 is a vapor deposition chamber in reserve for forming a layer containing an organic compound or a metal material layer.

Setting the EL material in these film-forming chambers is preferably performed by using a manufacturing system as described below. Namely, it is preferable that the film-forming is performed by using the EL material which has previously been put in a container (crucible as a typical example) by a material manufacturer. Further, such setting is preferably executed without exposing the EL material to air; therefore, it is preferable that, when the container, namely, crucible, is delivered from the material manufacturer, the crucible is put in a second container in a sealed manner and then introduced into the film-forming chamber as it is. Desirably, setting chambers 126R, 126G, 126B, 126E, and 126H, each of which is provided with a vacuum-evacuation device, connected to respective film-forming chambers 106R, 106G, 106B, 106E, and 106H are allowed to be in a vacuum state or an inert gas atmosphere, and under these circumstances the crucible is taken out of the second container in any one of the setting chambers to set the crucible in any one of the film-forming chambers. In such manner, not only the crucible but also the EL material put in the crucible are prevented from being contaminated. It is, also, possible that the metal mask is stored in any one of the setting chambers 126R, 126G, 126B, 126E, and 126H.

By appropriately selecting the EL material to be set in respective film-forming chambers 106R, 106G, 106B, 106E, and 106H, the light emitting element which emits either mono-color (specifically white color) or full-color (specifically red, green, and blue colors) light as a whole body of the light emitting device can be manufactured. For example, when a green-color light emitting element is fabricated, a hole transport layer or a hole injection layer, a light emitting layer (G), and an electron transport layer or an electron injection layer are laminated in this sequence in the film-forming chamber 106H, in the film-forming chamber 106G, and in the film-forming chamber 106E, respectively, and then, a cathode is formed on the resultant laminar constitution to obtain the green-color light emitting element. For example, when a full-color light emitting element is fabricated, a hole transport layer or a hole injection layer, a light emitting layer (R), and an electron transport layer or an electron injection layer are laminated in this sequence in the film-forming chamber 106R by using a vapor deposition mask prepared exclusively for R, and then, a hole transport layer or a hole injection layer, a light emitting layer (G), and an electron transport layer or an electron injection layer are laminated in this sequence over the above-formed laminar constitution in the film-forming chamber 106G by using a vapor deposition mask prepared exclusively for G and, thereafter, a hole transport layer or a hole injection layer, a light emitting layer (B), and an electron transport layer or an electron injection layer are laminated in this sequence over the above-formed laminar constitution in the film-forming chamber 106B by using a vapor deposition mask prepared exclusively for B and, subsequently, a cathode is formed over the resultant laminar constitution to obtain the full-color light emitting element.

Further, in a case of laminating light emitting layers having different luminescent colors from one another, an organic compound layer which shows a white-color luminescence is roughly classified into two types, namely, a 3 wavelength type which contains 3 primary colors of red, green and blue and a 2 wavelength type which utilizes a relationship of complimentary colors of blue/yellow or bluish green/orange. It is also possible to fabricate a white-color light emitting element in one film-forming chamber. For example, when the white-color light emitting element is fabricated by using the 3 wavelength type, a plurality of vapor deposition source holders are prepared in one film-forming chamber and therein, an aromatic diamine (TPD) is filled in a first vapor deposition source holder in a sealed manner, p-EtTAZ is similarly filled in a second vapor deposition source holder, $Alq_3$ is similarly filled in a third vapor deposition source holder, an EL material in which $Alq_3$ is added with Nile Red that is a red luminescent pigment is similarly filled in a fourth vapor deposition source holder, and $Alq_3$ is similarly filled in a fifth vapor deposition source holder Then, under these configurations the first to fifth vapor deposition source holders are set in respective film-forming chambers. Thereafter, the first to fifth vapor deposition source holders start to move in sequence, and then vapor deposition is performed on the substrate in a lamination manner. Specifically, TPD is sublimated from the first vapor deposition source holder by heating, thereby being deposited on an entire surface of the substrate. Thereafter, p-EtTAZ is sublimated from the second vapor deposition source holder, $Alq_3$ is, sublimated from the third vapor deposition source holder, $Alq_3$:Nile Red is sublimated from the fourth vapor deposition source holder, and $Alq_3$ is sublimated from the fifth vapor deposition source holder whereupon all these sublimated materials are deposited on an entire surface of the substrate in order. Subsequently, when a cathode is formed on the resultant substrate, a white-color light emitting element can be fabricated.

After the layers each containing the organic compound are appropriately laminated in accordance with the above-described process, the substrate is transported from the transport chamber 104a to the delivery chamber 107 and, further, from the delivery chamber 107 to the transport chamber 108 without exposing the substrate to air.

Next, the substrate is transported into the film-forming chamber 110 by a transport mechanism provided in the transport chamber 108, and then, a cathode is formed over the substrate in the film-forming chamber 110. As for the cathode, a metal film (a film of an alloy of, for example, MgAg, MgIn, $CaF_2$, LiF, or CaN, a film formed by using an element belonging to group I or II in the periodic table and aluminum by means of co-vapor deposition, or a laminate thereof) formed by utilizing resistance heating by means of vapor deposition is used. Further, the cathode may also be formed by sputtering.

When a top emission type light emitting device is manufactured, it is preferable that a cathode is transparent or translucent. It is also preferable that a thin film (1 nm to 10 nm) of the above-described metal film, or a laminate of the thin film (1 nm to 10 nm) of the above-described metal film and an conductive transparent film is allowed to be the cathode. In this case, a film comprising the transparent conductive film (for example, indium oxide-tin oxide alloy (ITO), indium oxide-zinc oxide alloy ($In_2O_3$—ZnO), or zinc oxide (ZnO)) may be formed in the film-forming chamber 109 by using sputtering.

A light emitting device having a laminar constitution is manufactured by the process described above.

Further, the substrate is transported into the film-forming chamber 113 connected to the transport chamber 108, and then, in the film-forming chamber 113, a protective film comprising a silicon nitride film or a silicon oxynitride film may be formed to seal it. In the present embodiment, a target comprising silicon or a target comprising silicon oxide, or a target comprising silicon nitride is provided in the film-forming chamber 113. For example, a silicon nitride film can be formed over the cathode by using a target comprising silicon and by allowing the inside of the film-forming chamber to be in a nitrogen gas atmosphere or an atmosphere containing nitrogen and argon gases. Further, a thin film (for example, DLC film, CN film, or amorphous carbon film) containing carbon as a primary component may be formed as a protective film, and separately, a film-forming chamber using chemical vapor deposition (CVD) may be provided. A diamond-like carbon film (referred to also as DLC film) can be formed by at least one method selected from the group consisting of: plasma CVD (as a typical example, RF plasma CVD, microwave CVD, electron cyclotron resonance (ECR) CVD, or hot-filament CVD), combustion-flame, sputtering, ion beam vapor deposition, and laser vapor deposition. As for reaction gases to be used in film-forming, a hydrogen gas, and at least one of hydrocarbon-type gases (for example, $CH_4$, $C_2H_2$, and $C_6H_6$) are used. These gases are ionized by glow discharge, and after being accelerated in velocity, the resultant ions collides with a cathode which is applied with negative self-bias, thereby forming a film. Further, the CN film may be formed by using $C_2H_4$ gas and $N_2$ gas as reaction gas. Still further, the DLC film or the CN film is a transparent or translucent insulating film against visible light. The term "transparent against visible light" used herein is intended to mean that a transmission factor of the visible light is in the range of from 80% to 100% while the term "translucent against visible light" used herein is intended to mean that a transmission factor of the visible light is in the range of from 50% to 80%. In the present embodiment, a protective film comprising a laminate comprising a first inorganic insulating film, a stress relaxing film, and a second inorganic insulating film is formed over a cathode. For example, it is permissible that, after the cathode is formed, the substrate is transported into the film-forming chamber 113 where the first inorganic insulating film is formed and, then, the resultant substrate is transported into the film-forming chamber 132 where the stress relaxation layer (for example, a layer containing an organic compound) having a hygroscopic property and transparency is formed thereon and, thereafter, the resultant substrate is transported back to the film-forming chamber 113 where the second inorganic insulating film is formed thereon.

Next, the substrate over which a light emitting element is thus formed is transported from the transport chamber 108 to the delivery chamber 111 without exposing the substrate to air, and then, from the delivery chamber 111 to the transport chamber 114. Subsequently, the substrate over which the light emitting element is formed is transported from the transport chamber 114 to the sealing chamber 116.

A sealed substrate is set in a load chamber 117 from outside and ready to be processed. Further, it is preferable that, in order to remove impurities such as moisture, the substrate has previously been subjected to annealing under vacuum. When a sealing material is formed for bonding the sealed substrate with the substrate over which the light emitting element is formed, the sealing material is formed in the sealing chamber and the sealed substrate over which the sealing material was formed is transported into the sealed substrate stock chamber 130. Further, a desiccant may be attached to the sealed substrate in the sealing chamber. Still further, in the present embodiment, an example in which the sealing material is formed over the sealed substrate is described; however, the present invention is by no means limited to the example and the sealing material may be formed over the substrate over which the light emitting element has previously been formed.

Next, the substrate and the sealed substrate are bonded to each other in the sealing chamber 116, and then, the thus-bonded pair of substrates is irradiated with ultraviolet light by using an ultraviolet ray irradiation mechanism provided in the sealing chamber 116 to cure the sealing material. Further, in the present embodiment, an ultraviolet ray-curing type resin is used as the sealing material; however, no particular limitation is put on the sealing material so long as it is an adhesive.

Subsequently, the thus-bonded pair of substrates are transported from the sealing chamber 116 to the transport chamber 114, and then, from the transport chamber 114 to the extraction chamber 119 where the resultant substrate is taken out.

As described above, since the light emitting element is not exposed to air at all until it is sealed in a sealed space by using the manufacturing apparatus as shown in FIG. 6, a light emitting device having high reliability can be manufactured. Further, although a vacuum state and a nitrogen atmosphere under an atmospheric pressure are alternately repeated in the transport chambers 114 and 118, it is preferable that the transport chambers 102, 104a, and 108 are consistently maintained in a vacuum state.

Although not shown, a control device, which realizes automation by controlling a pathway along which the substrate is moved into each treatment chamber, is provided.

Further, in the manufacturing apparatus as shown in FIG. 6, it is also possible that a substrate, over which a transparent conductive film (or metal film (TiN)) is provided as an anode is transported in, and after a layer containing an organic compound is formed over the substrate, a transparent or translucent cathode (for example, a laminate of a thin metal film (for example, Al, or Ag) and a transparent conductive film) is formed over the resultant substrate to fabricate an top emission type (or top-bottom emission type) light emitting element. The term "top emission type light emitting element" used herein is intended to mean an element which takes out luminescence that is generated in the organic compound layer by allowing it to pass through the cathode.

Further, in the manufacturing apparatus as shown in FIG. 6, it is also possible that a substrate, over which a transparent conductive film is provided as an anode, is transported in, and, after a layer containing an organic compound is formed over the substrate, a cathode comprising a metal film (for example, Al, or Ag) is formed over the substrate to fabricate a bottom emission type light emitting element. The term "bottom emission type light emitting element" used herein is intended to mean an element which takes out luminescence that is generated in the organic compound layer from a transparent electrode, namely, an anode, in the direction of TFT, and further, allows the luminescence to pass through the substrate.

Further, the present embodiment can freely be combined with any one of Embodiment Modes 1 to 3 and Example 1.

Embodiment 3

An example of obtaining a full-color light emitting element by selectively forming layers containing respective organic compounds, which can obtain R, G, and B luminescence by using a manufacturing apparatus as described in Embodiment 2, will be described below.

In the present embodiment, an example, in which a light emitting area of each of a red-color light emitting element, a green-color light emitting element, and a blue-color light emitting element which are different in light emitting efficiency from one another is allowed to be changed, will be described. Further, it is preferable that film thickness of a hole transport layer or a hole injection layer, or an electron transport layer or an electron injection layer is appropriately changed in order to correspond to each luminescent color. In the present embodiment, an example in which a red-color light emitting area is larger than a blue-color light emitting area which is larger than a green-color light emitting area is described and should not be interpreted as limiting the present invention in any way.

Figure 7A:
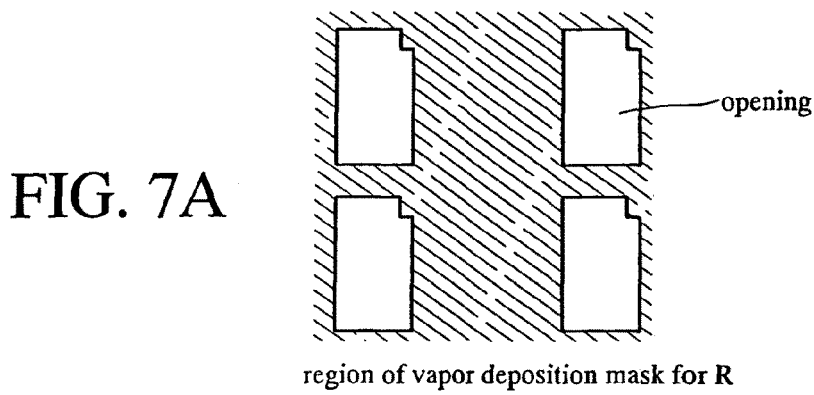
FIGS. 7A to 7D show schematic views of a vapor deposition mask according to Embodiment 3, respectively.
Figure 7B:
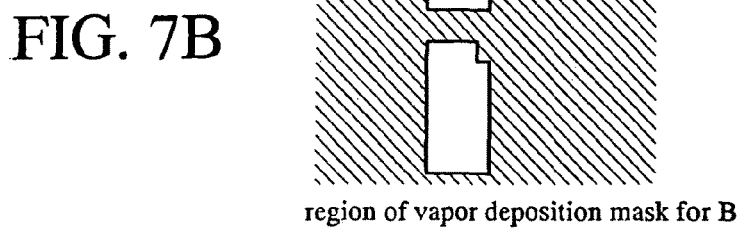
Figure 7C:
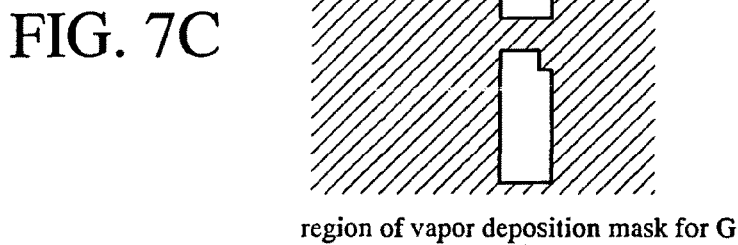

FIG. 7A shows a view of a vapor deposition mask for R; FIG. 7B shows a view of a vapor deposition mask for B; and FIG. 7C shows a view of a vapor deposition mask for G.

Figure 7D:
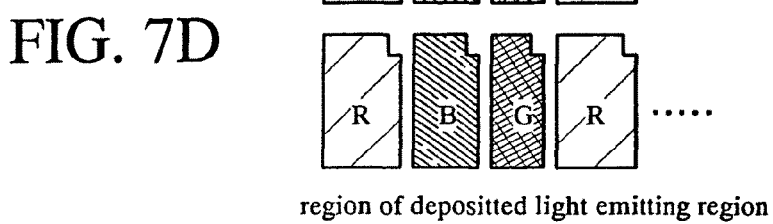

When a hole transport layer or a hole injection layer, a light emitting layer (R), and an electron transport layer or an electron injection layer are laminated in this sequence in the film-forming chamber 106R by using a vapor deposition mask (see FIG. 7A) prepared for R and, then, a hole transport layer or a hole injection layer, a light emitting layer (G), and an electron transport layer or an electron injection layer are laminated in this sequence in the film-forming chamber 106G by using a vapor deposition mask (see FIG. 7C) prepared for G and, thereafter, a hole transport layer or a hole injection layer, a light emitting layer (B), and an electron transport layer or an electron injection layer are laminated in this sequence in the film-forming chamber 106B by using a vapor deposition mask (see FIG. 7B) prepared for B and, subsequently. A cathode is subsequently formed over the resultant laminate, and then, a full-color light emitting element can be fabricated. A part of the thus-fabricated light emitting region (light emitting region corresponding to 8 pixels) is shown in FIG. 7D.

Further, the present embodiment can freely be combined with any one of Embodiment Modes 1 to 3, and Examples 1 and 2.

Embodiment 4

In the present embodiment, an example of an element which not only enhances mobility of a carrier by relaxing an energy barrier that is present in an organic compound film, but also performs function separation of a laminar constitution while holding respective functions of plurality of various types of materials as well, is described.

In regard to relaxation of the energy barrier in the laminar constitution, a technique of inserting a carrier injection layer is well referred to. That is, by inserting a material which relaxes the energy barrier present in an interface of the laminar constitution having a large energy barrier into the interface, a design can be made such that the energy barrier is set in a stepwise pattern. By making such design, a property of a carrier injection from the electrode can be enhanced to surely reduce a drive voltage to certain extent. However, there is a problem in that, by increasing a number of layers, a number of organic interfaces are increased as well. It is considered that such feature is the reason why a monolayer constitution rather holds top data of drive voltage/power efficiency. In other words, by overcoming the problem, the laminar constitution can reach the drive voltage/power efficiency of the monolayer constitution, while maintaining a merit (capability of combinations of various types of materials free from necessity of a complicated design of molecules) of the laminar constitution.

Under these circumstances, in the present embodiment, when an organic compound film comprising a plurality of functional regions is formed between a cathode and an anode of a light emitting element, a constitution having a mixed region, which is different from a conventional laminar constitution in which a distinct interface is present, comprising simultaneously a material which constitutes a first functional region and another material which constitutes a second functional region is formed between the first functional region and the second functional region.

The present embodiment also includes the case where a material that is capable of converting triplet excitation energy into light emission is added to the mixed region as a dorpant. In addition in the formation of the mixed region, the mixed region may be formed to have a connection gradient.

It is considered that, by applying such constitution as described above, the energy barrier which is present between functional regions is reduced compared with the conventional constitution, thereby improving the carrier injection property. That is, the energy barrier between functional regions is relaxed by forming the mixed region and, accordingly, prevention of reduction for drive voltage and luminance can be realized.

Therefore, in the present embodiment, when a light emitting element comprising at least a region (referred to as a first functional region) in which a first organic compound can exhibit a function thereof and another region (referred to as a second functional region) in which a second organic compound, being different from a substance which constitutes the first functional region, can exhibit a function thereof, and a light emitting device comprising such light emitting element are manufactured, a mixed region, containing the organic compound which constitutes the first functional region and another organic compound which constitutes the second functional region, is prepared between the first functional region and the second functional region.

A film-forming apparatus is configured such that an organic compound film having a plurality of functional regions can be formed in one film-forming chamber, and a plurality of vapor deposition sources are provided in correspondence with such plurality of functional regions.

Figure 8A:
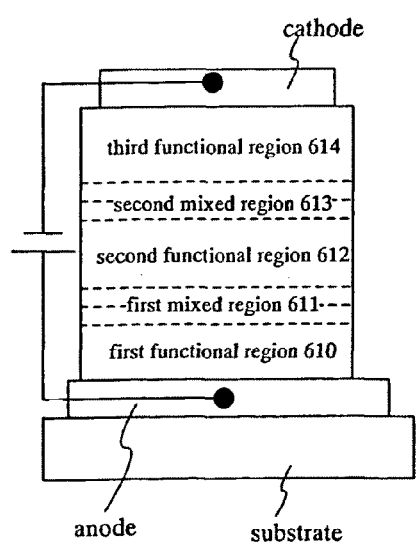
FIGS. 8A and 8B each show a schematic diagram explaining an element constitution according to Embodiment 4.

Firstly, a first organic compound is vapor deposited. The first organic compound, which has previously been vaporized by resistance heating, is scattered in the direction of the substrate by opening a shutter at the time of vapor deposition, and accordingly, a first functional region 610 as shown in FIG. 8A can be formed.

Next, while keeping a state in which the first organic compound is vapor deposited, a first shutter is opened, and then, a second organic compound is vapor deposited. Further, the second organic compound which has also previously been vaporized by resistance heating is scattered in the direction of the substrate by opening a second shutter at the time of vapor deposition. Accordingly, a first mixed region 611 comprising the first organic compound and the second organic compound can be formed.

Then, after a while, only the first shutter is closed to allow the second organic compound to be vapor deposited. Accordingly, a second functional region 612 can be formed.

Further, in the present embodiment, a case in which the mixed region is formed by allowing two types of organic compounds to be simultaneously vapor deposited is described. However, it is also possible that the first organic compound is first vapor deposited, and then, a mixed region is formed between the first functional region and the second functional region by allowing the second organic compound to be vapor deposited in an atmosphere of such vapor deposition of the first organic compound.

Subsequently, while keeping a state in which the second organic compound is vapor deposited, a third shutter is opened, and then, a third organic compound is vapor deposited. Further, the third organic compound, which has also previously been vaporized by resistance heating, is scattered in the direction of the substrate by opening the shutter at the time of vapor deposition. Accordingly, a second mixed region 613 comprising the second organic compound and the third organic compound can be formed.

Then, after a while, only the second shutter is closed to allow the third organic compound to be vapor deposited. Accordingly, a third functional region 614 can be formed.

Finally, a light emitting element is completed by forming a cathode over the resultant substrate.

Figure 8B:
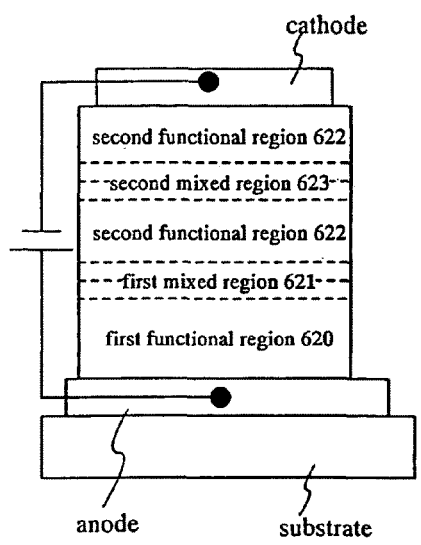

Further, as for another organic compound films as shown in FIG. 8B, after a first functional region 620 is formed by using the first organic compound, a first mixed region 621 comprising the first organic compound and the second organic compound is formed, and then, a second functional region 622 is formed by using the second organic compound. Thereafter, in a midway in which the second functional region 622 is formed, the third shutter is temporarily opened to allow a third organic compound to be simultaneously vapor deposited, and then the second mixed region 623 is formed.

Then, after a while, the second functional region 622 is formed again by closing the third shutter. Thereafter, a cathode is formed over the resultant substrate, thereby fabricating a light emitting element.

Since an organic compound film having a plurality of functional regions can be formed in one film-forming chamber, a functional region interface is not contaminated by impurities, and also, a mixed region can be formed in a functional region interface. Under these circumstances, a light emitting element having no distinct laminar constitution (namely, free from a distinct organic interface) but having a plurality of functions can be fabricated.

Further, when the film-forming unit which can perform vacuum annealing before, during, or after a film-forming operation is executed is employed, a more fitting intermolecular state in the mixed region can be established by performing vacuum annealing during the film-forming operation is executed. Accordingly, it becomes possible to prevent the drive voltage and luminance from being reduced. Further, impurities, such as oxygen and moisture containing in the organic compound layer that has been formed over the substrate are further removed by performing such annealing (evacuation) operation after the film is formed. Thus, the organic compound layer having high density and high purity can be formed.

Further, the present embodiment can be freely combined with any one of Embodiment Modes 1 to 3 and Embodiment 1 to 3.

Embodiment 5

Various modules (active matrix type liquid crystal module, active matrix type EL module and active matrix type EC module) can be completed by implementing the present invention. Thus, all of the electronic apparatuses incorporated these modules into display portions can be completed.

Following can be given as such electronic apparatuses: video cameras; digital cameras; head mounted displays (goggle type displays); car navigation systems; projectors; car stereos; personal computers; portable information terminals (mobile computers, mobile phones or electronic books etc.) etc. Practical examples thereof are shown in FIGS. 9A to 9E and FIGS. 10A to 10C.

Figure 9A:
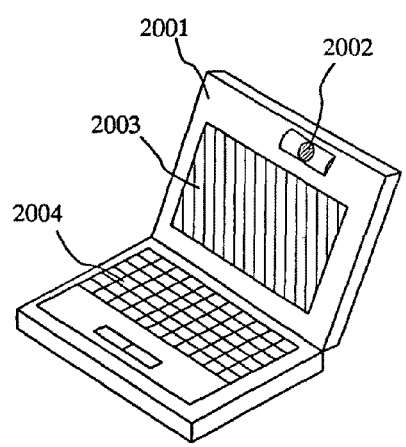
FIGS. 9A to 9E schematically illustrate examples of electronic apparatuses according to Embodiment 5.

FIG. 9A is a personal computer which comprises: a main body 2001; an image input portion 2002; a display portion 2003; and a keyboard 2004 etc.

Figure 9B:
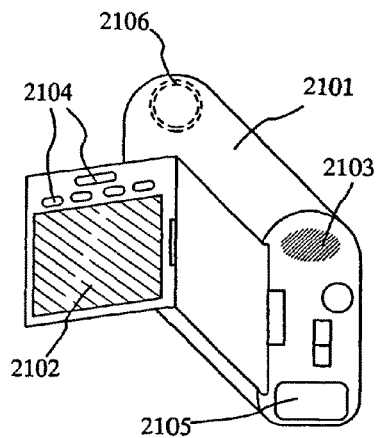

FIG. 9B is a video camera which comprises: a main body 2101; a display portion 2102; a voice input portion 2103; operation switches 2104; a battery 2105 and an image receiving portion 2106 etc.

Figure 9C:
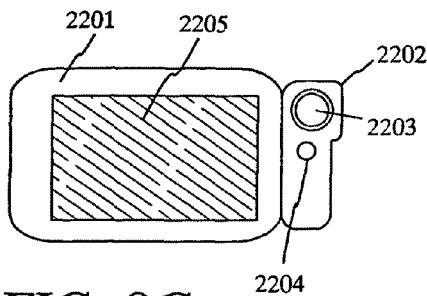

FIG. 9C is a mobile computer which comprises: a main body 2201; a camera portion 2202; an image receiving portion 2203; operation switches 2204 and a display portion 2205 etc.

Figure 9D:
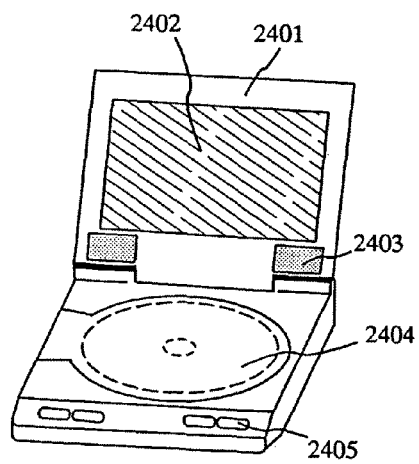

FIG. 9D is a player using a recording medium recording a program (hereinafter, recording medium)which comprises: a main body 2401; a display portion 2402; a speaker portion 2403; a recording medium 2404 and an operation switch 2405 etc. Note that a DVD (Digital Versatile Disc), a CD or the like is used as a recording medium for this player, and that application of listening music, viewing movie, game or the Internet can be done.

Figure 9E:
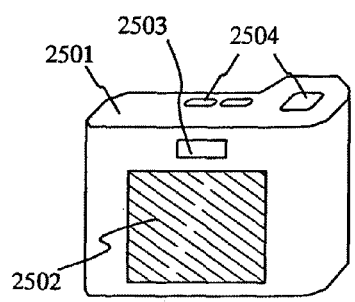

FIG. 9E is a digital camera which comprises: a main body 2501; a display portion 2502; a view finder 2503; operation switches 2504; and an image receiving portion (not shown in the figure) etc.

Figure 10A:
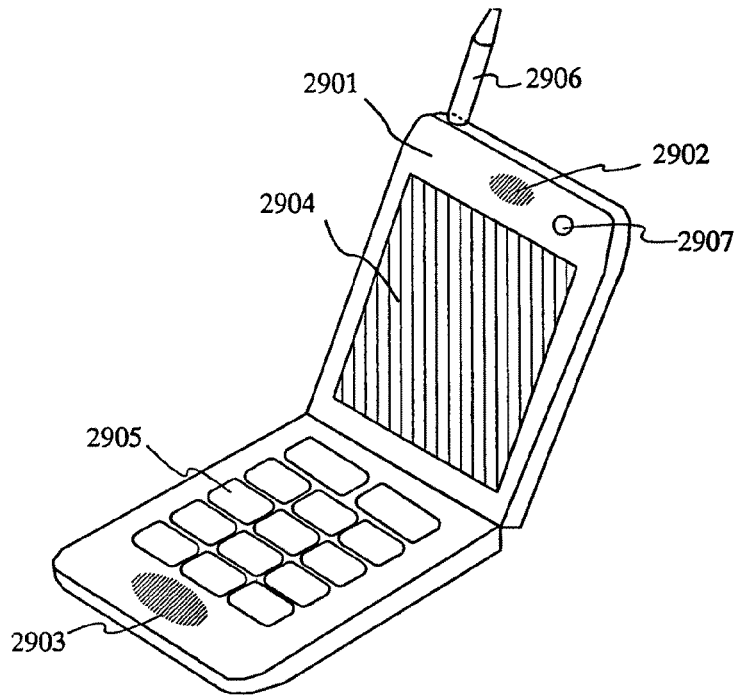
FIGS. 10A to 10C schematically illustrate examples of electronic apparatuses according to Embodiment 5.

FIG. 10A is a mobile phone which comprises: a main body 2901; a voice output portion 2902; a voice input portion 2903; a display portion 2904; operation switches 2905; an antenna 2906; and an image input portion (CCD, image sensor, etc.) 2907 etc.

Figure 10B:
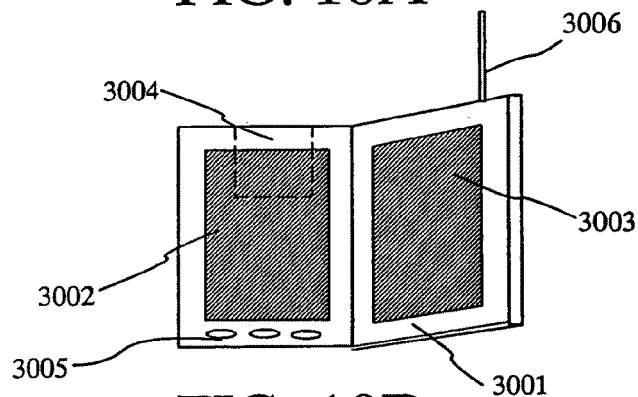

FIG. 10B is a portable book (electronic book) which comprises: a main body 3001; display portions 3002 and 3003; a recording medium 3004; operation switches 3005 and an antenna 3006 etc.

Figure 10C:
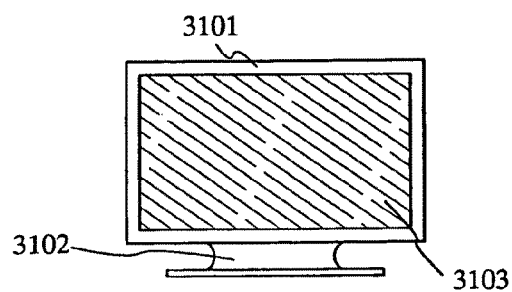

FIG. 10C is a display which comprises: a main body 3101; a supporting portion 3102; and a display portion 3103 etc.

In addition, the display shown in FIG. 10C has a screen in small, medium or large size, for example a size of 5 to 20 inches. Further, to manufacture the display part with such sizes, it is preferable to mass-produce by taking multiple pattern using a substrate with one meter on a side.

As described above, the applicable range of the present invention is so wide that the invention can be applied to electronic apparatuses of various fields. Note that the electronic apparatuses of this embodiment can be achieved by utilizing any combination of constitutions in Embodiment Mode 1 to 3 and Embodiment 1 to 4.

Embodiment 6

The electronic apparatuses represented in Embodiment Mode 5 includes a panel in which a light emitting element is sealed, loaded a module provided with a controller and an IC including a circuit such as a power source circuit. The module and the panel are both corresponding to one mode of the light emitting device. In the present invention, a specific configuration of the module will be described.

Figure 11A:
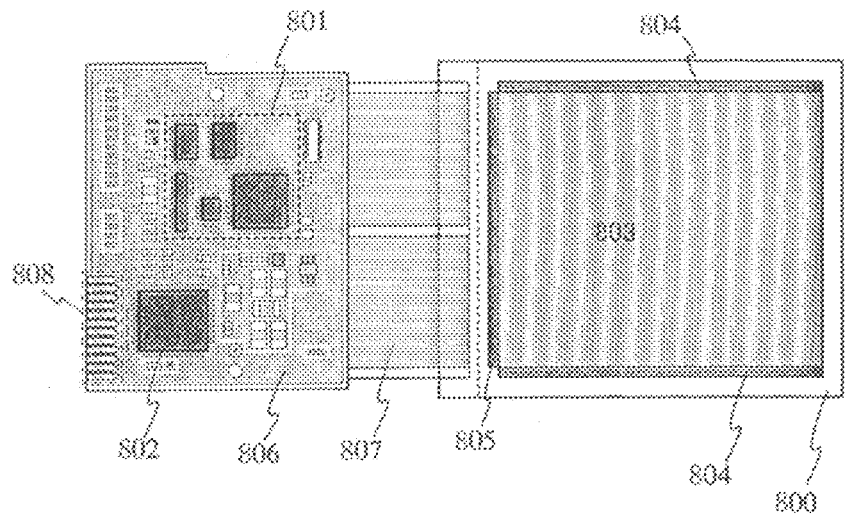
FIGS. 11A and 11B each show a schematic diagram of a module according to Embodiment 6.

FIGS. 11A shows an appearance of a module in which a panel 800 is provided with a controller 801 and a power source circuit 802. There are provided in the panel 800 with a pixel portion 803 in which a light emitting element is provided in each pixel, a gate line driving circuit 804 for selecting a pixel in the pixel portion 803, and a source line driving circuit 805 for supplying a video signal to the selected pixel.

The controller 801 and the power source circuit 802 are provided in a printed substrate 806. Various signals or power source voltage, which are output from the controller 801 or the power source circuit 802 respectively, are supplied through FPC 807 to the pixel portion 803, the gate line driving circuit 804, and the source line driving circuit 805 on the panel 800.

Through an interface (I/F) 808 in which a plurality of input terminals are arranged, power source voltage and various signals to the printed circuit 806 is supplied.

Although the printed substrate 806 is attached to the panel 800 with FPC in the present embodiment, the present invention is not limited to this configuration. The controller 801 and the power source circuit 802 may be provided directly in the panel 800 with COG (Chip on Glass) manner.

Further, as for the printed circuit 806, there is a case that a capacity formed between leading wirings and a resistance of a wiring itself cause a noise to a power source voltage or a signal, or make a rise of a signal dull. Therefore, it may be prevent the noise to the power source voltage or a signal and the dull rise of the signal to provide various kinds of elements such as a capacitor and a buffer in the printed substrate 806.

Figure 11B:
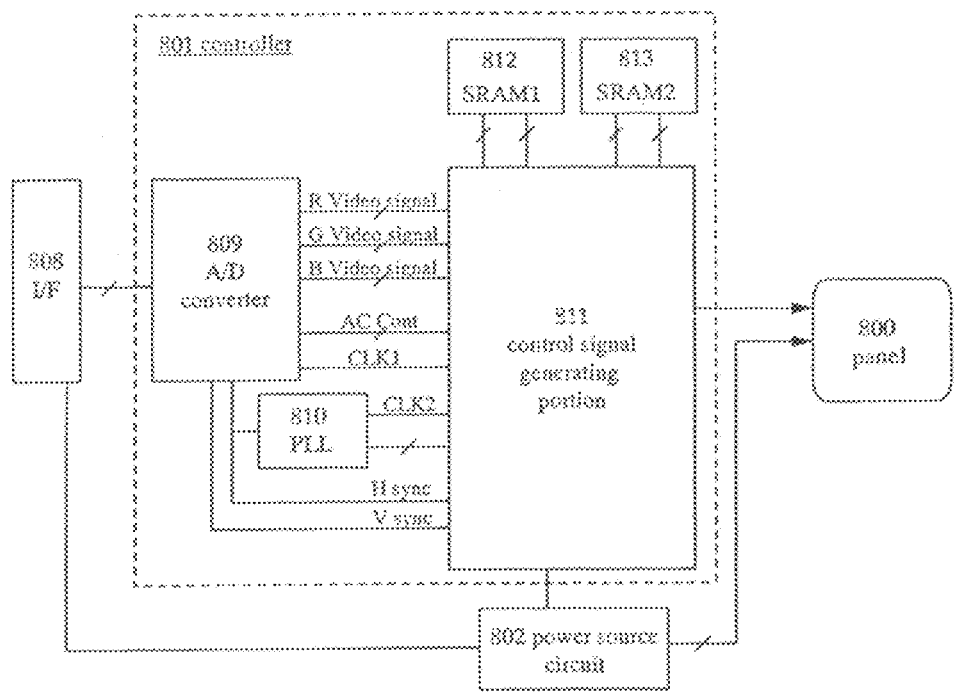

FIG. 11B is a block diagram showing a configuration of the printed substrate 806. Various kinds of signals and power source voltage supplied to the interface 808 are supplied to the controller 801 and the power source circuit 802.

The controller 801 has an A/D converter 809, a phase locked loop(PLL) 810, control signal generating portion 811, and SRAM( Static Random Access Memory) 812 and 813. Although the SRAM is used in the present embodiment, instead of the SRAM, SDRAM can be used and DRAM (Dynamic Random Access Memory) can also be used if it is possible to write in and read out data at high speed.

Video signals supplied via the interface 808 are subjected to a parallel-serial conversion in the A/D converter 809 to be input into the control signal generating portion 811 as video signals corresponding to respective colors of R,G, and B. Further, based on various kinds of signals supplied via the interface 808, Hsync signal, Vsync signal, clock signal CLK, and a volts alternating current (AC cont) are generated in the A/D converter 809 to be input into the control signal generating portion 811.

The phase locked loop 810 has a function of synchronizing frequencies of the various kinds of signals supplied via the interface 808 and an operation frequency of the control signal generating portion 811. The operation frequency of the control signal generating portion 811 is not always the same as the frequencies of the various kinds of signals supplied via the interface 808, however, the frequency of the control signal generating portion 811 is controlled in the phase locked loop 810 in order to synchronize each other.

The video signals input to the control signal generating portion 811 are once written in SRAM 812 and 813 and stored. In the control signal generating portion 811, video signals stored in the SRAM 812 which is corresponding to all pixels are read out per one bit, and input to a signal line driving circuit 805 of the panel 800.

Further, in the control signal generating portion 811, information for each bit regarding a period during which the light emitting element emits light, is input to a scanning line driving circuit 804 of the panel 800.

In addition, the power source circuit 802 supplies a predetermined supply voltage to the signal line driving circuit 805, the scanning line driving circuit 804 and the pixel portion 803 of the panel 800.

Next, a detailed configuration of the power source circuit 802 will be described with FIG. 12. The power source circuit 802 of the present embodiment is composed of a switching regulator 854 that employs four switching regulator controls 860 and a series regulator 855.

In general, a switching regulator is smaller and lighter than a series regulator, and capable of not only step-down but also step-up, and inversion of positive and negative. On the other hand, the seried regulator is used only for step-down while an output voltage has a high precision, compared to the switching regulator, and there are almost no possibility for occurrence of a ripple or a noise. The power source circuit 802 in the present embodiment uses the both combined.

Figure 12:
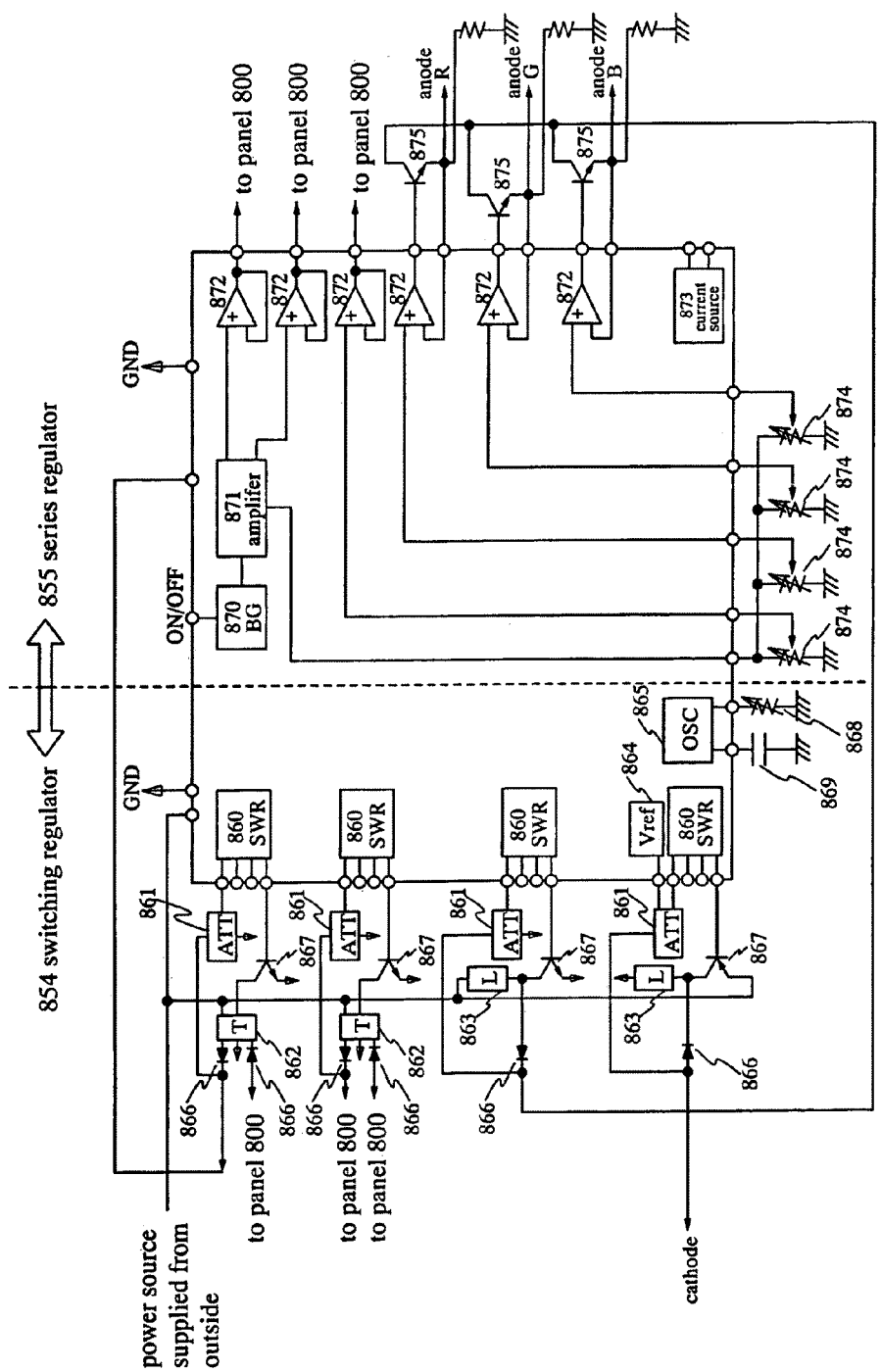
FIG. 12 schematically shows a block diagram according to Embodiment 6.

The switching regulator 854 shown in FIG. 12 has the switching regulator controls (SWR) 860, attenuators (ATT) 861, transformers (T) 862, inductors (L) 863, a reference power source (Vref) 864, an oscillation circuit (OSC) 865, diodes 866, bipolar transistor 867, a variable resistor 868, and a capacity 869.

When a voltage of such an outside Li ion buttery (3.6V) is converted in the switching regulator 854, a power source voltage given to a cathode and a power source voltage supplied to a switching regulator 854 are generated.

Further, a series regulator 855 has a band gap circuit (BG) 870, an amplifier 871, operation amplifiers 872, a current source 873, variable resistors 874 and bipolar transistors 875, and a power source voltage generated in a switching regulator 854 is supplied thereto.

In a series regulator 855, based on a predetermined electronic voltage generated in the band gap circuit 870, a power source voltage of a direct current is generated, which is to be given a wiring (referred to also as a wiring for the current supply) for supplying a current to an anode of a light emitting element corresponding to each color using a direct current of power source voltage generated in switching regulator 854.

Still, a current source 873 is used in the case of the driving method that the electric current of video signal is written in the pixel. In this case, the electric current generated in current source 873 is provided for a signal line driving circuit 805. However, a current source 873 is not indispensable in the case the driving method that voltage of a video signal is written in the pixel.

It is possible to form a switching regulator, an OSC, an amplifier and an operation amplifier using TFT.

The present embodiment may be freely combined with any of the structures of Embodiment Mode 1 to 3 and Embodiment 1 to 5.

Embodiment 7

Also, a stress relaxing film can be provided between a metal layer and a inorganic insulating film. An example thereof is shown in FIGS. 13A and 13B.

Figure 13A:
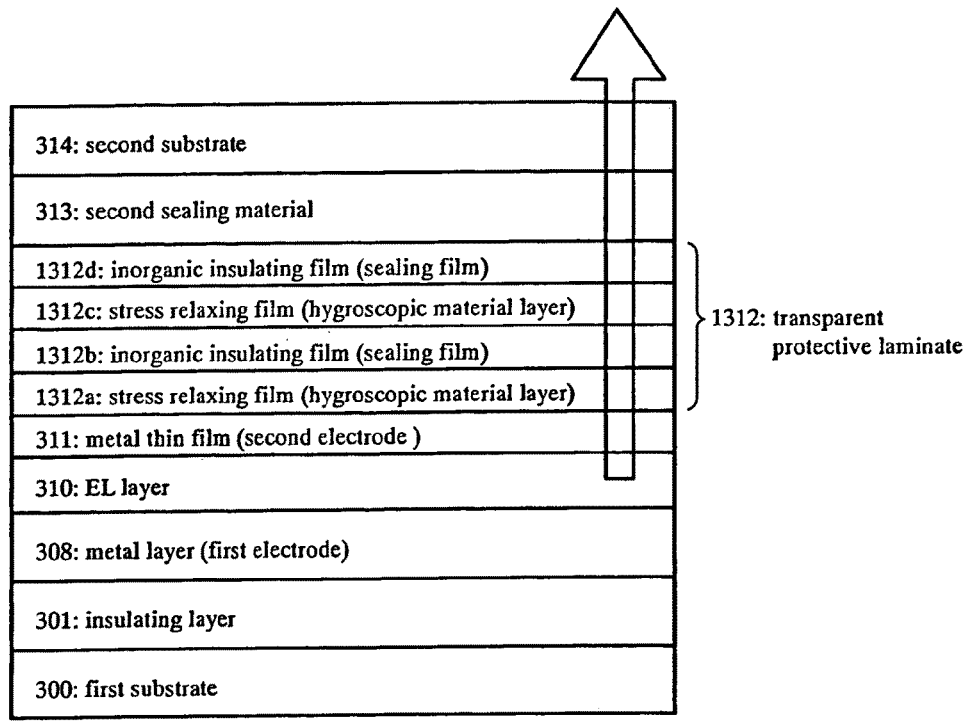
FIGS. 13A and 13B are cross-sectional views of Embodiment 7, respectively.
Figure 13B:
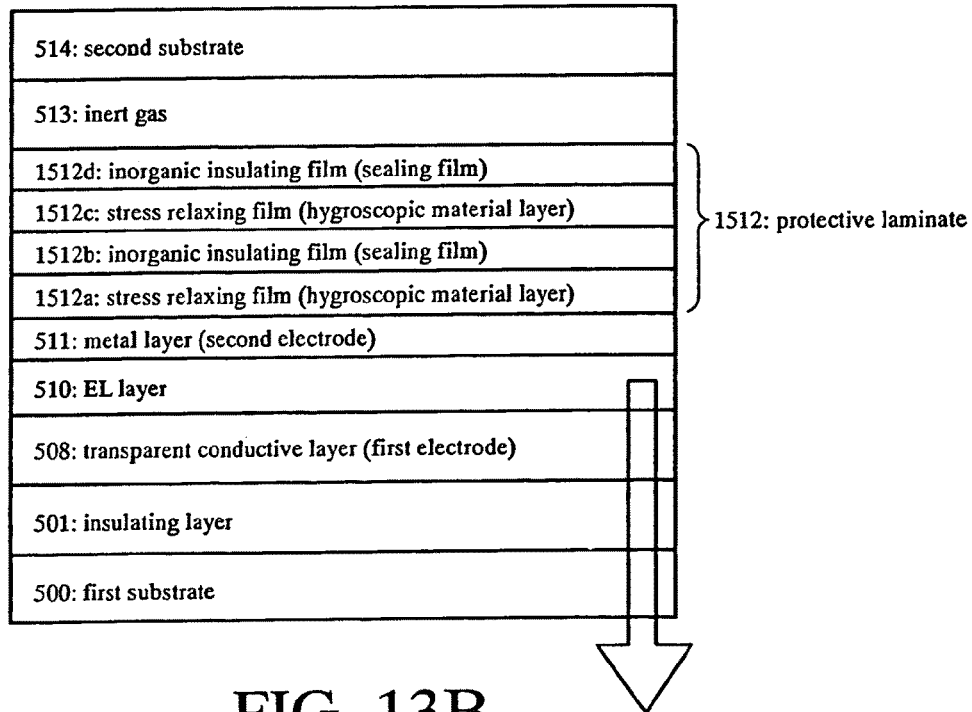

Since the example shown in FIG. 13A is constituted in a same manner as in FIG. 1A except for a part (a transparent protective laminate), same reference numerals are applied to parts identical to those in FIG. 1A.

Reference numeral 1312 denotes a transparent protective laminate to be formed by sputtering or vapor deposition and the layer becomes a sealing film which not only protects the second electrode 311 comprising a metal thin film but also prevents penetration of moisture. As shown in FIG. 13A, the transparent protective laminate 1312 comprises a laminate comprising a stress relaxing film 1312a, an inorganic insulating film 1312b, a stress relaxing film 1312c, and an inorganic insulating film 1312d.

The structure shown in FIG. 13A is effective when the difference between the film stress of a second electrode 311 and the film stress of an inorganic insulating film 1312b is wide. Further, stress can be relaxed and, also, moisture can be absorbed by sandwiching the stress relaxing film 1312a between the second electrode 311 and the inorganic insulating film 1312b.

As for materials for the stress relaxing film 1312a and 1312c, a material which has smaller stress than the inorganic insulating films 1312b and 1312d and has a hygroscopic property is preferable. In addition to the above-described properties material having a translucent property is desirable. As for the stress relaxing film 1312a and 1312c, a material film containing an organic compound such as α-NPD (4,4'-bis[N-(naphthyl)-N-phenyl-amino]biphenyl), BCP (bathocuproin), MTDATA (4,4',4"-tris(N-3-methylphenyl-N-phenyl-amino)triphenylamine), and Alq$_3$ (a tris-8-quinolinolate aluminum complex) may be used. These material films each have a hygroscopic property. When they become thin in thickness, they become nearly transparent. Since MgO, SrO$_2$, and SrO each have a hygroscopic property and translucent property and a thin film thereof can be obtained by vapor deposition, any one of these oxides can be used as the stress relaxing film 1312a and 1312c.

As for the stress relaxing film 1312a and 1312c, the same material used in a layer, containing an organic compound, which is sandwiched between the cathode and the anode can also be used.

The present embodiment can be freely combined with Embodiment Mode 1.

Also, the other example is shown in FIG. 13B. Since the example shown in FIG. 13B is constituted in a same manner as in FIG. 3B except for a transparent protective laminate, same reference numerals are applied to parts identical to those in FIG. 3B.

Reference numeral 1512 denotes a protective laminate to be formed by sputtering or vapor deposition and the layer becomes a sealing film which not only protects the second electrode 511 comprising a metal thin film but also prevents penetration of moisture. As shown in FIG. 13B, the transparent protective laminate 1512 comprises a laminate comprising a stress relaxing film 1512a, an inorganic insulating film 1512b, a stress relaxing film 1512c, and an inorganic insulating film 1512d.

Since Embodiment Mode 7 is a bottom emission type, the protective laminate 1512 is not necessarily transparent and film thickness can be thick.

The structure shown in FIG. 13B is effective when the difference between the film stress of a second electrode 511 and the film stress of an inorganic insulating film 1512b is wide. Further, stress can be relaxed and, also, moisture can be absorbed by sandwiching the stress relaxing film 1512a between the second electrode 511 and the inorganic insulating film 1512b.

As for materials for the stress relaxing film 1512a and 1512c, a material which has smaller stress than the inorganic insulating films 1312b and 1312d and has a hygroscopic property is preferable. As for the stress relaxing film 1512a and 1512c, a material film containing an organic compound such as α-NPD (4,4'-bis[N-(naphthyl)-N-phenyl-amino]biphenyl), BCP (bathocuproin), MTDATA (4,4',4"-tris(N-3-methylphenyl-N-phenyl-amino)triphenylamine, and Alq$_3$ (a tris-8-quinolinolate aluminum complex) may be used. Since MgO, SrO$_2$, and SrO each have a hygroscopic property and a thin film thereof can be obtained by vapor deposition, any one of these oxides can be used as the stress relaxing film 1512a and 1512c.

As for the stress relaxing film 1512a and 1512c, the same material used in a layer containing an organic compound, which is sandwiched between the cathode and the anode can also be used.

Further, the present embodiment can freely be combined with any one of Embodiment Modes 1 to 3, and Embodiments 1 to 6.

According to the present invention, a protective layer having high blocking effect against oxygen and moisture can be provided and a light emitting device having a high-reliability can be realized.

What is claimed is:
1. A light emitting device comprising:
a first substrate;

a light emitting element over the first substrate;
a laminate over the light emitting element; and
a second substrate over the laminate,
wherein the light emitting element comprises:
  an anode;
  a layer containing an organic light emitting compound over the anode; and
  a cathode over the layer containing the organic light emitting compound,
wherein the laminate comprises:
  a first inorganic insulating film;
  a first film comprising an organic compound having a hygroscopic property on the first inorganic insulating film; and
  a second inorganic insulating film on the first film,
wherein the light emitting element is covered by the laminate,
wherein a top surface of the cathode is in contact with the first inorganic insulating film, and
wherein a luminescence from the light emitting element is passed through the first substrate.

2. The light emitting device according to claim 1, wherein the first film has a smaller stress than that of at least one of the first inorganic insulating film and the second inorganic insulating film.

3. The light emitting device according to claim 1, wherein at least one of the first inorganic insulating film and the second inorganic insulating film comprises at least one film selected from the group consisting of a silicon nitride film, a silicon oxide film, a silicon oxynitride film, a DLC film, a CN film, and a laminate thereof.

4. The light emitting device according to claim 1, wherein at least one of the first inorganic insulating film and the second inorganic insulating film is a silicon nitride film formed by RF sputtering using silicon as a target.

5. The light emitting device according to claim 1, wherein the light emitting element and a TFT connected to the light emitting element are provided over the first substrate.

6. The light emitting device according to claim 1, wherein the first film is formed by vapor deposition.

7. The light emitting device according to claim 1, wherein the first film is a polymeric material film containing the organic compound, obtained by coating.

8. A semiconductor device comprising the light emitting device of claim 1, wherein the semiconductor device is at least one member selected from a group consisting of a video camera, a digital camera, a display, a car navigation system, a personal computer, and a portable information terminal.

9. The light emitting device according to claim 1, wherein the first film comprises a material selected from the group consisting of α-NPD (4,4'-bisbiphenyl), BCP (bathocuproin), MTDATA (4,4',4"-tris(N-3-methylphenyl-N-phenyl-amino)triphenylamine), and Alg$_3$ (a tris-8-quinolinolate aluminum complex).

10. The light emitting device according to claim 1, wherein the first film comprises a material selected from the group consisting of MgO, SrO$_2$, and SrO.

11. A light emitting device comprising:
a first substrate;
a light emitting element over the first substrate;
a laminate over the light emitting element; and
a second substrate over the laminate,
wherein the light emitting element comprises:
  an anode;
  a layer containing an organic light emitting compound over the anode; and
  a cathode over the layer containing the organic light emitting compound,
wherein the laminate comprises:
  a first inorganic insulating film;
  a first film comprising an organic compound having a hygroscopic property on the first inorganic insulating film; and
  a second inorganic insulating film on the first film,
wherein the light emitting element is covered by the laminate,
wherein a top surface of the cathode is in contact with the first inorganic insulating film,
wherein a luminescence from the light emitting element is passed through the first substrate, and
wherein the first film comprises a same material as that of at least one layer of a plurality of layers which constitute the layer containing the organic light emitting compound sandwiched between the cathode and the anode.

12. The light emitting device according to claim 11, wherein the first film has a smaller stress than that of at least one of the first inorganic insulating film and the second inorganic insulating film.

13. The light emitting device according to claim 11, wherein at least one of the first inorganic insulating film and the second inorganic insulating film comprises at least one film selected from the group consisting of a silicon nitride film, a silicon oxide film, a silicon oxynitride film, a DLC film, a CN film, and a laminate thereof.

14. The light emitting device according to claim 11, wherein at least one of the first inorganic insulating film and the second inorganic insulating film is a silicon nitride film formed by RF sputtering using silicon as a target.

15. The light emitting device according to claim 11, wherein the light emitting element and a TFT connected to the light emitting element are provided over the first substrate.

16. The light emitting device according to claim 11, wherein the first film is formed by vapor deposition.

17. The light emitting device according to claim 11, wherein the first film is a polymeric material film containing the organic compound, obtained by coating.

18. A semiconductor device comprising the light emitting device of claim 11, wherein the semiconductor device is at least one member selected from a group consisting of a video camera, a digital camera, a display, a car navigation system, a personal computer, and a portable information terminal.

19. The light emitting device according to claim 11, wherein the first film comprises a material selected from the group consisting of α-NPD (4,4'-bisbiphenyl), BCP (bathocuproin), MTDATA (4,4',4"-tris(N-3-methylphenyl-N-phenyl-amino)triphenylamine), and Alg$_3$ (a tris-8-quinolinolate aluminum complex).

20. The light emitting device according to claim 11, wherein the first film comprises a material selected from the group consisting of MgO, SrO$_2$, and SrO.

21. A light emitting device comprising:
a first substrate;
a light emitting element over the first substrate;
a first film having a hygroscopic property over the light emitting element;
a laminate over the first film; and
a second substrate over the laminate,
wherein the light emitting element comprises:
  an anode;
  a layer containing an organic light emitting compound over the anode; and
  a cathode over the layer containing the organic light emitting compound, wherein the laminate comprises:
a first inorganic insulating film;
a second film comprising an organic compound having a hygroscopic property on the first inorganic insulating film; and
a second inorganic insulating film on the second film,
wherein the first film having the hygroscopic property is covered by the laminate,
wherein a top surface of the cathode is in contact with the first film, and
wherein a luminescence from the light emitting element is passed through the first substrate.

22. The light emitting device according to claim 21, wherein the second film has a smaller stress than that of at least one of the first inorganic insulating film and the second inorganic insulating film.

23. The light emitting device according to claim 21, wherein at least one of the first inorganic insulating film and the second inorganic insulating film comprises at least one film selected from the group consisting of a silicon nitride film, a silicon oxide film, a silicon oxynitride film, a DLC film, a CN film, and a laminate thereof.

24. The light emitting device according to claim 21, wherein at least one of the first inorganic insulating film and the second inorganic insulating film is a silicon nitride film formed by RF sputtering using silicon as a target.

25. The light emitting device according to claim 21, wherein the light emitting element and a TFT connected to the light emitting element are provided over the first substrate.

26. The light emitting device according to claim 21, wherein the second film is formed by vapor deposition.

27. The light emitting device according to claim 21, wherein the second film is a polymeric material film containing the organic compound, obtained by coating.

28. A semiconductor device comprising the light emitting device of claim 21, wherein the semiconductor device is at least one member selected from a group consisting of a video camera, a digital camera, a display, a car navigation system, a personal computer, and a portable information terminal.

29. The light emitting device according to claim 21, wherein the second film comprises a material selected from the group consisting of α-NPD (4,4'-bisbiphenyl), BCP (bathocuproin), MTDATA (4,4',4''-tris(N-3-methylphenyl-N-phenyl-amino)triphenylamine), and Alq$_3$ (a tris-8-quinolinolate aluminum complex).

30. The light emitting device according to claim 21, wherein the second film comprises a material selected from the group consisting of MgO, SrO$_2$, and SrO.

31. A light emitting device comprising:
a first substrate;
a light emitting element over the first substrate;
a first film having a hygroscopic property over the light emitting element;
a laminate over the first film; and
a second substrate over the laminate,
wherein the light emitting element comprises:
an anode;
a layer containing an organic light emitting compound over the anode; and
a cathode over the layer containing the organic light emitting compound,
wherein the laminate comprises:
a first inorganic insulating film;
a second film comprising an organic compound having a hygroscopic property on the first inorganic insulating film; and
a second inorganic insulating film on the second film,
wherein the first film having the hygroscopic property is covered by the laminate,
wherein a top surface of the cathode is in contact with the first film, and
wherein a luminescence from the light emitting element is passed through the first substrate, and
wherein the second film comprises a same material as that of at least one layer of a plurality of layers which constitute the layer containing the organic light emitting compound sandwiched between the cathode and the anode.

32. The light emitting device according to claim 31, wherein the second film has a smaller stress than that of at least one of the first inorganic insulating film and the second inorganic insulating film.

33. The light emitting device according to claim 31, wherein at least one of the first inorganic insulating film and the second inorganic insulating film comprises at least one film selected from the group consisting of a silicon nitride film, a silicon oxide film, a silicon oxynitride film, a DLC film, a CN film, and a laminate thereof.

34. The light emitting device according to claim 31, wherein at least one of the first inorganic insulating film and the second inorganic insulating film is a silicon nitride film formed by RF sputtering using silicon as a target.

35. The light emitting device according to claim 31, wherein the light emitting element and a TFT connected to the light emitting element are provided over the first substrate.

36. The light emitting device according to claim 31, wherein the second film is formed by vapor deposition.

37. The light emitting device according to claim 31, wherein the second film is a polymeric material film containing the organic compound, obtained by coating.

38. A semiconductor device comprising the light emitting device of claim 31, wherein the semiconductor device is at least one member selected from a group consisting of a video camera, a digital camera, a display, a car navigation system, a personal computer, and a portable information terminal.

39. The light emitting device according to claim 31, wherein the second film comprises a material selected from the group consisting of α-NPD (4,4'-bisbiphenyl), BCP (bathocuproin), MTDATA (4,4',4''-tris(N-3-methylphenyl-N-phenyl-amino)triphenylamine), and Alq$_3$ (a tris-8-quinolinolate aluminum complex).

40. The light emitting device according to claim 31, wherein the second film comprises a material selected from the group consisting of MgO, SrO$_2$, and SrO.

* * * * *

UNITED STATES PATENT AND TRADEMARK OFFICE
CERTIFICATE OF CORRECTION

PATENT NO. : 8,362,487 B2  
APPLICATION NO. : 11/802961  
DATED : January 29, 2013  
INVENTOR(S) : Shunpei Yamazaki et al.

Page 1 of 1

It is certified that error appears in the above-identified patent and that said Letters Patent is hereby corrected as shown below:

In the Claims:

Column 35, line 54, Claim 9, "and $Alg_3$" should read "and $Alq_3$"

Column 36, line 50, Claim 19, "and $Alg_3$" should read "and $Alq_3$"

Column 38, line 53, Claim 20, "and $Alg_3$" should read "and $Alq_3$"

Signed and Sealed this  
Twentieth Day of August, 2013

Teresa Stanek Rea  
*Acting Director of the United States Patent and Trademark Office*